(12) United States Patent
Mishima et al.

(10) Patent No.: US 11,309,741 B2
(45) Date of Patent: Apr. 19, 2022

(54) RESONANCE OSCILLATOR CIRCUIT AND CONTACTLESS POWER SUPPLY SYSTEM

(71) Applicants: OMRON Corporation, Kyoto (JP); NATIONAL UNIVERSITY CORPORATION CHIBA UNIVERSITY, Chiba (JP)

(72) Inventors: Taichi Mishima, Kizugawa (JP); Shingo Nagaoka, Kizugawa (JP); Takeshi Uematsu, Kyoto (JP); Hiroo Sekiya, Chiba (JP)

(73) Assignees: OMRON CORPORATION, Kyoto (JP); NATIONAL UNIVERSITY CORPORATION CHIBA UNIVERSITY, Chiba (JP)

( * ) Notice: Subject to any disclaimer, the term of this patent is extended or adjusted under 35 U.S.C. 154(b) by 0 days.

(21) Appl. No.: 17/106,865

(22) Filed: Nov. 30, 2020

(65) Prior Publication Data
US 2021/0203187 A1 Jul. 1, 2021

(30) Foreign Application Priority Data
Dec. 27, 2019 (JP) .............................. JP2019-239021

(51) Int. Cl.
*H02J 50/12* (2016.01)
*H03B 5/12* (2006.01)
(Continued)

(52) U.S. Cl.
CPC ................ *H02J 50/12* (2016.02); *H02J 7/02* (2013.01); *H02M 3/28* (2013.01); *H03B 5/1228* (2013.01)

(58) Field of Classification Search
CPC ............................ H03B 5/1228; H02J 50/12
(Continued)

(56) References Cited

U.S. PATENT DOCUMENTS

| 4,945,466 A * | 7/1990 | Borland | ............ H02M 3/33507 363/97 |
| 2008/0285613 A1* | 11/2008 | Murray | ................ H01S 3/0971 372/55 |

(Continued)

OTHER PUBLICATIONS

Ozawa et al., "Proposal of Load-Independent Class-E-1 Inverter", The Institute of Electronics, Information and Communication Engineers; IEICE Technical Report EE2018-45; pp. 43-48; Jan. 2019.
(Continued)

*Primary Examiner* — Joseph Chang
(74) *Attorney, Agent, or Firm* — Cantor Colburn LLP

(57) ABSTRACT

A resonance oscillator circuit is provided to include first and second oscillators. The first oscillator includes a first LC resonator circuit and an amplifier element, and oscillates by shifting a phase of an output voltage with a predetermined phase difference and feeding the output voltage back to the amplifier element. The second oscillator oscillates by generating a gate signal, which has a frequency identical to that of the output voltage, and drives the amplifier element, by shifting the phase of the output voltage with the phase difference and feeding the gate signal back to an input terminal of the amplifier element, by using the amplifier element as a switching element and using the first oscillator as a feedback circuit. The phase difference is a value substantially independent of an inductance of the first LC resonator circuit and a load, to which the output voltage is applied.

16 Claims, 23 Drawing Sheets

(51) Int. Cl.
*H02M 3/28* (2006.01)
*H02J 7/02* (2016.01)

(58) Field of Classification Search
USPC .......................................................... 307/104
See application file for complete search history.

(56) References Cited

U.S. PATENT DOCUMENTS

2017/0179772 A1* 6/2017 Asanuma ............ H02J 7/00034
2017/0353048 A1* 12/2017 Abidi ...................... H02J 50/10

OTHER PUBLICATIONS

Ahmadi et al., "A Self-Tuned Class-E Power Oscillator," IEEE Transactions on Power Electronics; vol. 34, No. 5; May 2019; 16 pages.

* cited by examiner

RESONANCE OSCILLATOR CIRCUIT AND CONTACTLESS POWER SUPPLY SYSTEM

CROSS REFERENCE TO RELATED APPLICATIONS

The present invention claims priority under 35 U.S.C. § 119 to Japanese Patent Application No. 2019-239021, filed on Dec. 27, 2019, the entire content of which is incorporated herein by reference.

BACKGROUND OF THE INVENTION

Field of the Invention

The present invention relates to a resonance oscillator circuit and a contactless power supply system using the resonance oscillator circuit.

Description of Related Art

In the prior art, a mobile object such as an automatic guided vehicle (AGV) is equipped with a rechargeable battery such as a lithium-ion battery. When this rechargeable battery is charged, after the AGV moves to a charging station, contactless charging is performed in a contactless charging system by electromagnetically coupling a power receiving coil mounted on the AGV to a power transmitting coil of the charging station.

PRIOR ART DOCUMENTS

Non Patent Documents

Non-Patent Document 1: Mohammad Mandi Ahmadi, et al., "A Self-Tuned Class-E Power Oscillator," IEEE TRANSACTIONS ON POWER ELECTRONICS, VOL. 34, NO. 5, May 2019.

Non-Patent Document 2: Yuta Ozawa et al., "Proposal of Load-Independent Class-$E^{-1}$ Inverter", Institute of Electronics, Information and Communication Engineers Research Technical Report, EE2018-45, January 2019.

However, the contactless charging system has the following two problems as illustrated in FIG. 9A.

(Problem 1) When a positional relationship between the power transmitting coil and the power receiving coil changes, an inductance changes, and a resonance frequency $f_r$ changes. As a result, the switching frequencies $f_{sw}$ and $f_r$ do not match to each other, and thus, an adverse effect such as efficiency deterioration arises. Accordingly, a mechanism for controlling a drive circuit of a switching element is required to match the switching frequency with the resonance frequency. In addition, since output characteristics such as an output voltage and an output current of a charging circuit change due to a change of the inductance, circuit design and control for satisfying a charging profile of the rechargeable battery become complicated.

(Problem 2) A load fluctuates depending on the remaining amount of the rechargeable battery, and as a result, the output characteristics such as the output voltage and the output current of the charging circuit fluctuate. Accordingly, the circuit design and control for satisfying the charging profile of the rechargeable battery become complicated.

Therefore, it is necessary to add the complicated control and the mechanism for the control in order to solve the above-described two problems, and there are problems such as a decrease in power conversion efficiency and increases in volume, weight, and cost.

SUMMARY OF THE INVENTION

The present invention has been made in order to solve the above problems, and an object thereof is to provide a resonance oscillator circuit for performing contactless power supply that does not require complicated control for solving the above-described two problems, and a contactless power supply system using the resonance oscillator circuit.

According to one aspect of the present invention, there is provided a resonance oscillator circuit including first and second oscillator circuits. The first oscillator includes a first LC resonator circuit and an amplifier element, and oscillates by shifting a phase of an output voltage with a predetermined phase difference and feeding the output voltage back to the amplifier element. The second oscillator oscillates by generating a gate signal, which has a frequency identical to that of the output voltage and drives the amplifier element, by shifting the phase of the output voltage with the phase difference and feeding the gate signal back to an input terminal of the amplifier element, by using the amplifier element as a switching element and using the first oscillator as a feedback circuit. The phase difference is a value substantially independent of an inductance of the first LC resonator circuit and a load, to which the output voltage is applied.

Accordingly, in accordance with the resonance oscillator circuit according to the present invention, since the output voltage of the resonance oscillator circuit does not depend on the load and the inductance of the first LC resonator circuit, it is possible to provide the resonance oscillator circuit for performing the contactless power supply that does not require the complicated control for solving the above-described two problems can be performed.

MODE FOR CARRYING OUT THE INVENTION

Hereinafter, embodiments according to the present invention will be described with reference to the drawings. The identical or same constituent elements will be assigned the identical reference signs.

Problems of Comparative Example

As described above, in order to solve Problem 1, for example, it is necessary to control the switching frequency $f_{sw}$ of the power transmission apparatus to be matches with the resonance frequency $f_r$, and control the output characteristics such as the output voltage and the output current of the charging circuit not to fluctuate. In addition, in order to solve Problem 2, it is necessary to control, for example, a voltage or a duty ratio of the power transmission apparatus such that the output characteristics such as the output voltage and the output current of the charging circuit do not fluctuate.

Comparative Example of Class-E Oscillator

Figure 5:
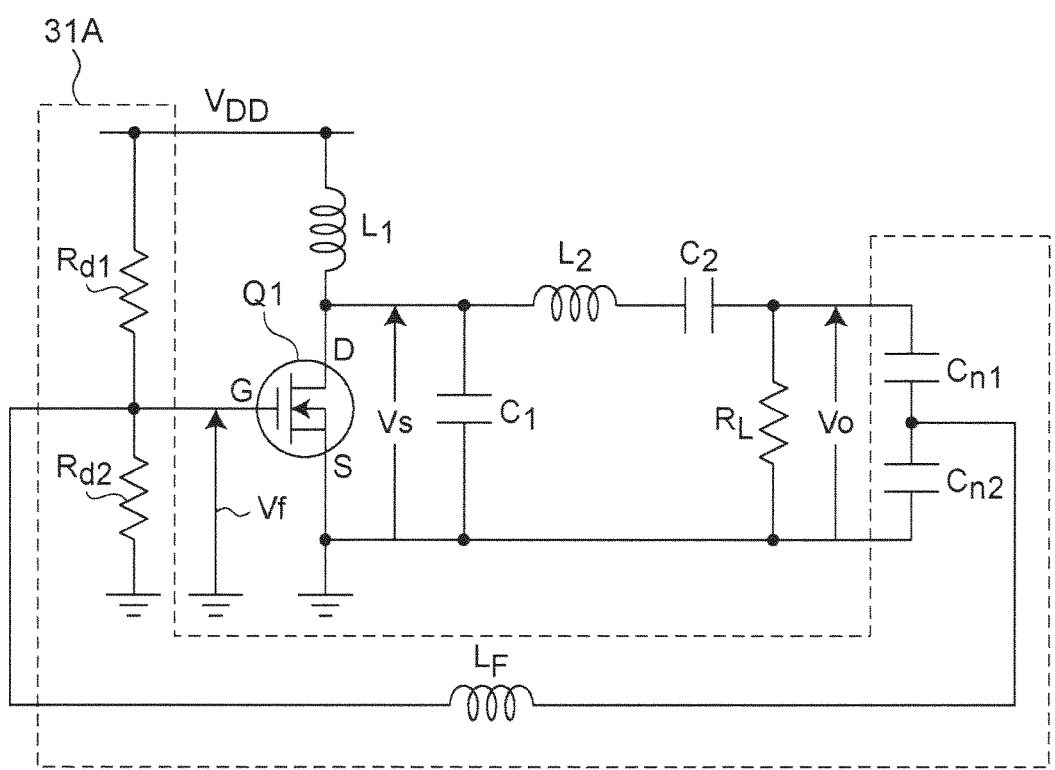
FIG. 5 is a circuit diagram illustrating a configuration example of a class-$E^{-1}$ oscillator 90 according to a comparative example.
Figure 6:
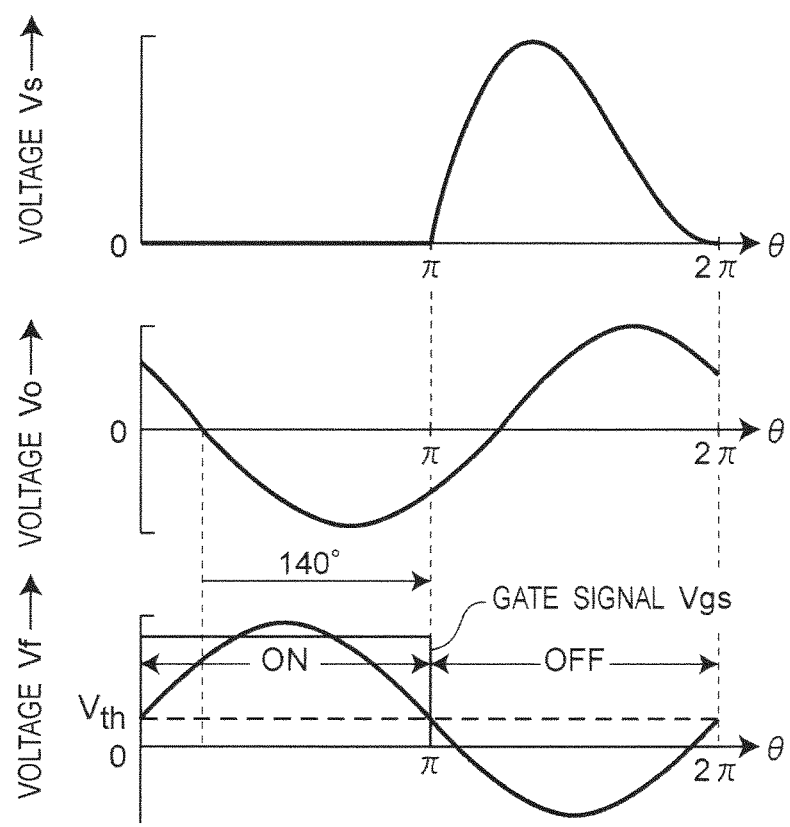
FIG. 6 is a waveform diagram of respective voltages illustrating an operation of the class-$E^{-1}$ oscillator 90 of FIG. 5.

FIG. 5 is a circuit diagram illustrating a configuration example of a class-E oscillator 90 according to a comparative example disclosed in Non-Patent Document 1, and FIG. 6 is a waveform diagram of respective voltages illustrating an operation of the class-E oscillator 90 of FIG. 5.

Referring to FIG. 5, the class-E oscillator 90 includes a DC bias circuit 31A including voltage-dividing resistors $R_{d1}$ and $R_{d2}$, a feedback inductor $L_F$, and voltage-dividing capacitors $C_{n1}$ and $C_{n2}$, a MOS field effect transistor (hereinafter, referred to as MOS transistor) Q1, inductors $L_1$ and $L_2$, capacitors $C_1$ and $C_2$, and a load resistor $R_L$.

In the class-E oscillator 90 of FIG. 5, a power supply voltage $V_{DD}$ is applied to a drain of the MOS transistor Q1 via the inductor $L_1$, and a DC bias voltage divided by the voltage-dividing resistors $R_{d1}$ and $R_{d2}$ is applied to a gate of the MOS transistor Q1. An output voltage Vo across both ends of a load resistor Ro is divided by the voltage-dividing capacitors $C_{n1}$ and $C_{n2}$, and then is applied as a gate signal to the gate of the MOS transistor Q1 via the feedback inductor $L_F$. An output source voltage Vs generated by the MOS transistor Q1 is outputted as the output voltage Vo to the load resistor $R_L$ via the capacitors $C_1$ and $C_2$ and the inductor $L_2$. In this case, a gate voltage Vf applied to the gate of the MOS transistor Q1 is a voltage shifted by 140 degrees with respect to the output voltage Vo as illustrated in FIG. 6.

In the class-E oscillator 90 having the above-described configuration disclosed in Non-Patent Document 1, since the phase of the gate voltage Vf can be shifted only by 140 degrees with respect to a waveform of the output voltage Vo, Problem 2 cannot be solved. Accordingly, there is such a problem that control for coping with the fluctuations in the inductance of the resonator circuit and the load is required.

Therefore, in the embodiments according to the present invention, a resonance oscillator circuit capable of solving both Problems 1 and 2 and a contactless power supply system using the resonance oscillator circuit will be described below.

First Embodiment

Figure 1:
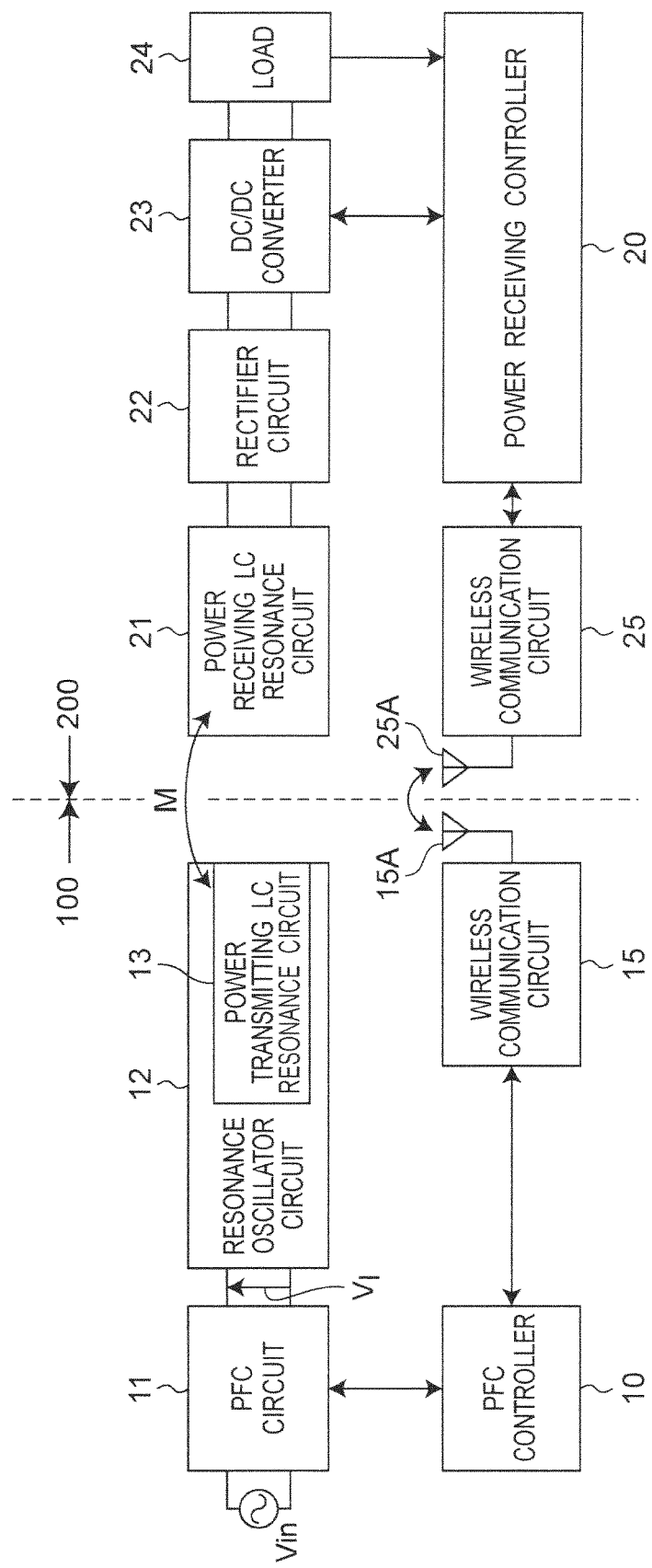
FIG. 1 is a block diagram illustrating a configuration example of a contactless power supply system according to a first embodiment.

FIG. 1 is a block diagram illustrating a configuration example of a contactless power supply system according to a first embodiment.

Referring to FIG. 1, the contactless power supply system according to the first embodiment includes a power transmission apparatus 100 and a power reception apparatus 200. In this case, the power transmission apparatus 100 includes a power factor correction circuit or a power factor compensation circuit (hereinafter, referred to as a PFC circuit) 11, a PFC controller 10 that controls an operation of the PFC circuit 11, a resonance oscillator circuit 12 including a power transmitting LC resonator circuit 13, and a wireless communication circuit 15 including an antenna 15A. Meanwhile, the power reception apparatus 200 includes a power receiving LC resonator circuit 21, a rectifier circuit 22, a DC/DC converter 23, a load 24, a power receiving controller 20 that controls operations of the DC/DC converter 23 and the like, and a wireless communication circuit 25 including an antenna 25A. In this case, the power transmission apparatus 100 and the power reception apparatus 200 are located close to each other for power supply such as charging. Accordingly, for example, the power transmitting LC resonator circuit 13 and the power receiving LC resonator circuit 21 are electromagnetically coupled to each other, and the wireless communication circuit 15 and the wireless communication circuit 25 transmit and receive necessary information data by performing wireless communication using the antennas 15A and 25A, respectively.

In the power transmission apparatus 100 of FIG. 1, for example, the PFC circuit 11 outputs an output voltage as an input voltage $V_I$ to the resonance oscillator circuit 12 by converting an input voltage Vin which is an AC voltage from an AC power supply such as a commercial AC power supply into a DC voltage and performing power factor correction processing on the input voltage by using a predetermined power factor correction method. The PFC controller 10 receives load information such as an output voltage and an output current for the load 24 from the power receiving controller 20 via the wireless communication circuits 25 and 15, and controls the PFC circuit 11 to perform the power factor correction processing based on the load information. In addition, the resonance oscillator circuit 12 is, for example, a resonance oscillator circuit 12-1 of FIG. 7A, and operates as an inverter circuit. The resonance oscillator circuit resonates at a predetermined resonance frequency $f_r$ based on the input voltage $V_I$ (or may be an external voltage or a power supply voltage $V_{DD}$) to generate an AC power including an AC voltage having the resonance frequency $f_r$ by using the power transmitting LC resonator circuit 13, and transmits the AC power to the power receiving LC resonator circuit 21 coupled to the power transmitting LC resonator circuit 13.

In the power reception apparatus 200 of FIG. 1, the power receiving LC resonator circuit 21 receives the AC power from the power transmitting LC resonator circuit 13, and outputs an AC voltage of the AC power to the rectifier circuit 22. The rectifier circuit 22 rectifies the input AC voltage to a DC voltage, and outputs the DC voltage to the DC/DC converter 23. Under the control of the power receiving controller 20, the DC/DC converter 23 converts the input DC voltage into a DC voltage having a predetermined voltage, and then outputs the DC voltage to the load 24. The power receiving controller 20 detects an output voltage and an output current for the load 24, and transmits load information including the information on the output voltage and the output current to the PFC controller 10 via the wireless communication circuits 25 and 15. The power receiving controller 20 also generates a predetermined gate signal based on the load information to control an inverter circuit included in the DC/DC converter 23. Thus, the power receiving controller controls the DC/DC converter 23 to output a predetermined load voltage.

It is noted that, the rectifier circuit 22 may be, for example, a rectifier circuit such as a half-wave rectifier circuit, a full-wave rectifier circuit, a full-bridge rectifier circuit, a half-active rectifier circuit, a voltage doubler rectifier circuit, or a current doubler rectifier circuit.

Figure 7A:
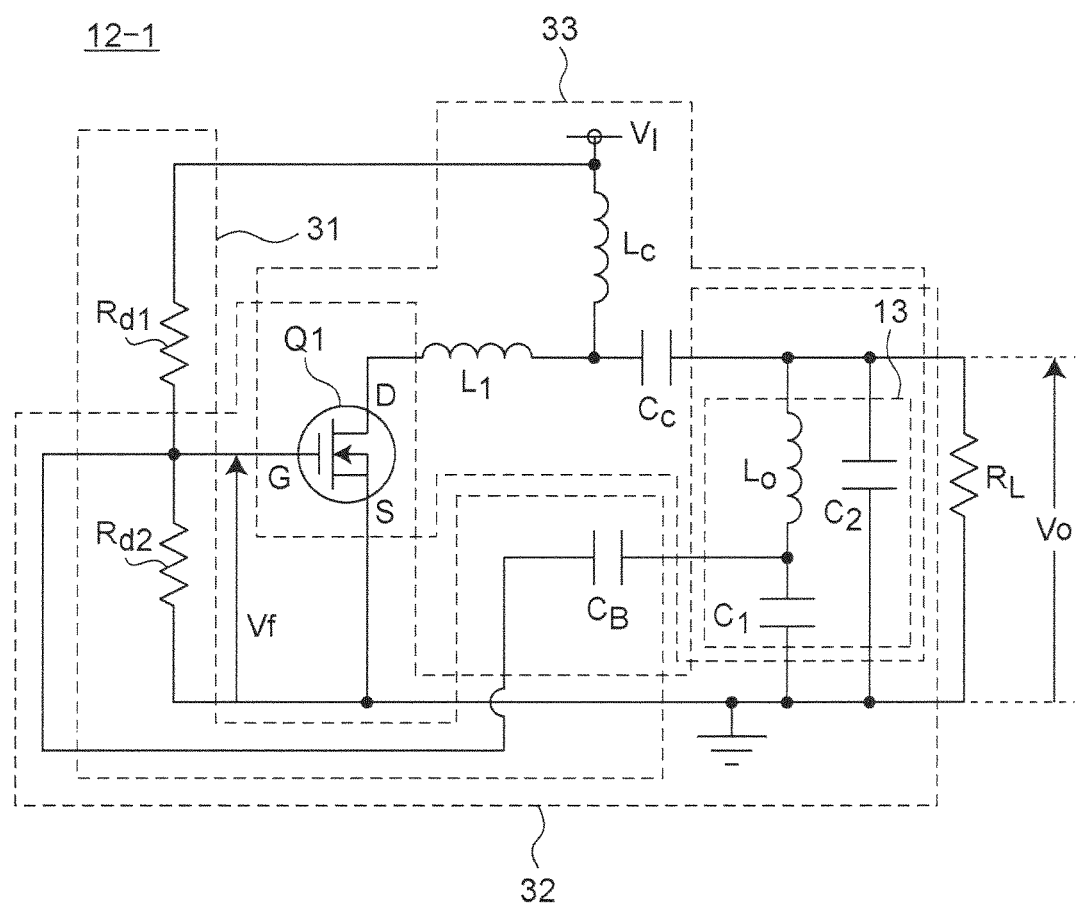
FIG. 7A is a circuit diagram illustrating a configuration example of a resonance oscillator circuit 12-1 according to a first implemental example.
Figure 8:
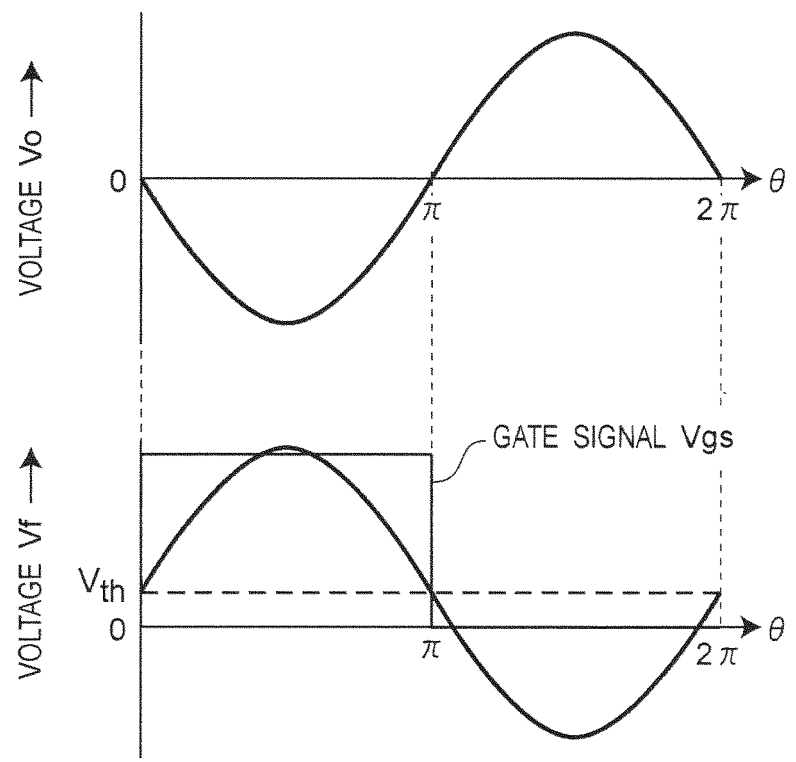
FIG. 8 is a waveform diagram of respective voltages illustrating an operation of the resonance oscillator circuit 12-1 of FIG. 7A.

FIG. 7A is a circuit diagram illustrating a configuration example of the resonance oscillator circuit 12-1 according to a first implemental example, and FIG. 8 is a waveform diagram of respective voltages illustrating an operation of the resonance oscillator circuit 12-1 of FIG. 7A. The resonance oscillator circuit 12-1 of FIG. 7A is, for example, a resonance oscillator circuit applicable to the contactless power supply system according to the first embodiment of FIG. 1.

Referring to FIG. 7A, the resonance oscillator circuit 12-1 includes (1) a Colpitts oscillator 32 that includes a power transmitting LC resonator circuit 13 and a MOS transistor Q1 of an amplifier element, and oscillates by shifting a phase of an output voltage with a predetermined phase difference and feeding the output voltage back to the MOS transistor Q1, (2) a class-$E^{-1}$ oscillator 33 that oscillates by generating a gate voltage Vf of a gate signal Vgs which has a frequency identical to that of the output voltage Vo and drives the MOS transistor Q1 by shifting a phase of the output voltage Vo with the phase difference to feed the gate voltage back to a certain gate which is an input terminal of the MOS transistor Q1 by using the MOS transistor Q1 as a switching element and the Colpitts oscillator 32 as a feedback circuit, and (3) a DC bias circuit 31 that is capable of switching the MOS transistor Q1 by the gate signal Vgs based on the input voltage $V_I$, generates a predetermined DC bias voltage, and applies the DC bias voltage to a gate of the MOS transistor Q1.

(4) The phase difference is a value set not to substantially depend on a load resistor $R_L$ to which the output voltage Vo is applied, and is 180 degrees in the resonance oscillator circuit 12-1 of FIG. 7A. It is noted that, the details of the phase difference other than 180 degrees for achieving load independence will be described later.

(5) The power transmitting LC resonator circuit (hereinafter, referred to as an LC resonator circuit) 13 is configured by including a series circuit of an inductor Lo and a capacitor $C_1$ and a parallel circuit of a capacitor $C_2$. It is noted that, the inductor Lo is electromagnetically coupled to an inductor of the power receiving LC resonator circuit 21 of the power reception apparatus 200.

Referring to FIG. 7A, the Colpitts oscillator 32 includes the MOS transistor Q1, a voltage-dividing resistor $R_{d2}$, a feedback capacitor CB, and the LC resonator circuit 13. In addition, the class-$E^{-1}$ oscillator 33 includes the MOS transistor Q1, the inductors Lo and $L_1$, a capacitor $C_c$, and the LC resonator circuit 13.

In this case, the input voltage $V_I$ is applied to the gate of the MOS transistor Q1 while being divided by the voltage-dividing resistors $R_{d1}$ and $R_{d2}$. The input voltage VI is also applied to a drain of the MOS transistor Q1 via the inductors $L_c$ and $L_1$. An oscillation voltage generated by the MOS transistor Q1 is outputted as a load voltage Vo to the load resistor $R_L$ via the inductor $L_1$, the capacitor Cc, and the LC resonator circuit 13. It is noted that, as for the output voltage Vo, a voltage at a connection point between the inductor Lo and the capacitor $C_1$ of the LC resonator circuit 13 is applied as the gate voltage Vf of the gate signal to the gate of the MOS transistor Q1 via the feedback capacitor $C_B$.

In this case, (1) $C_1$ and $C_2$ are resonance capacitors.

(2) $C_B$ is a coupling capacitor that cuts a DC component of a detected voltage to generate the gate voltage Vf That is, impedances other than the voltage-dividing resistors $R_{d1}$ and $R_{d2}$ are set not to be seen in the DC bias circuit 31, and thus, the gate voltage Vf of the gate signal constantly generates a constant voltage from the input voltage $V_I$ and a voltage-dividing resistance circuit.

(3) Lo is a self-inductor or an excitation inductor between the power transmitting and receiving coils.

An oscillation frequency (resonance frequency) $f_r$ of the Colpitts oscillator 32 of FIG. 7A is expressed by the following equation:

$$f_r = \frac{1}{2\pi\sqrt{L_o \frac{C_1 C_2}{C_1 + C_2}}}.$$

In the Colpitts oscillator 32, since the connection point of the capacitors $C_1$ and $C_2$ can be grounded, the phase difference can be set to 180 degrees by setting $C_1=C_2$. However, when the phase difference is set to a value other than 180 degrees, $C_1 \ne C_2$ may be set. In this case, since the electromagnetically coupled capacitor $C_2$ and the grounded resonance capacitor $C_1$ are included, the LC resonator circuit can be used, for example, in an inductive coupling type contactless power supply system (FIG. 1).

In the resonance oscillator circuit 12-1 having the aforementioned configuration, as illustrated in FIG. 8, the output voltage Vo which is a resonance waveform is detected, and the gate voltage Vf of the gate signal generates by shifting (that is, inverting) the phase by 180 degrees while maintaining the identical frequency. Accordingly, even though the resonance frequency $f_r$ fluctuates due to a change in an inductance of the inductor Lo, a switching frequency automatically follows the resonance frequency $f_r$, and output voltage characteristics independent of fluctuations in the inductance of the inductor Lo of the LC resonator circuit 13 and the load can be obtained. It is noted that, the phase difference may be set to a phase difference other than 180 degrees for achieving the load independence, as will be described in detail later.

Such a configuration will be described below by using a configuration example of a class-$E^{-1}$ oscillator 91 according to a comparative example of FIG. 10 disclosed in Non-Patent Document 2.

Figure 10:
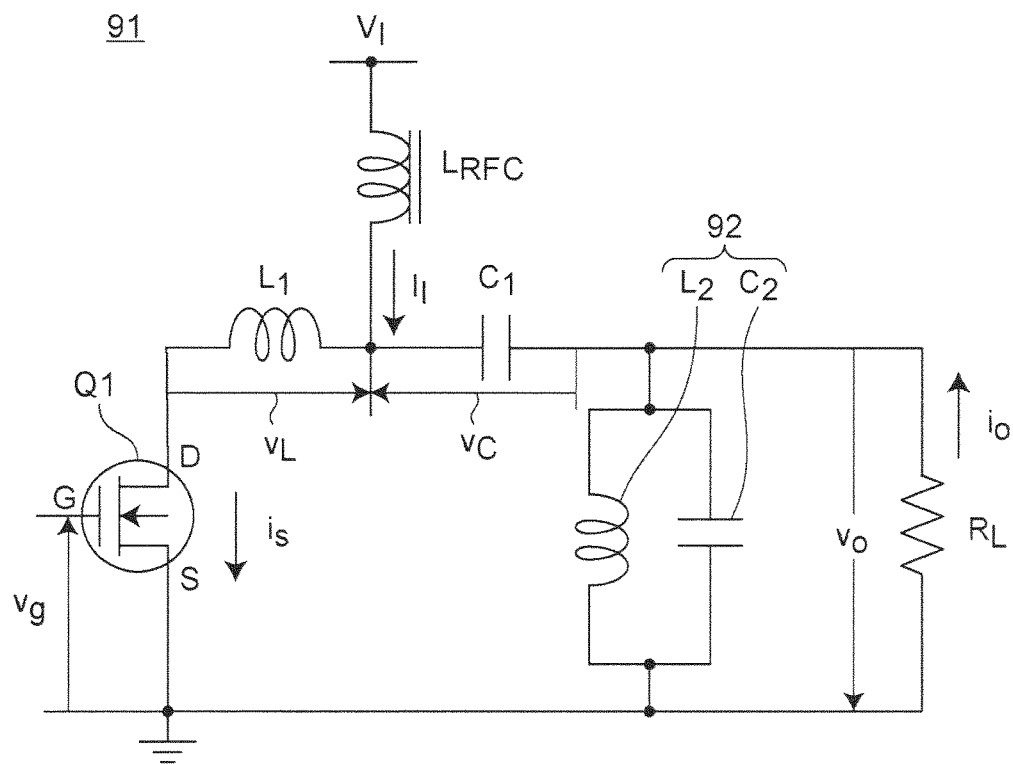
FIG. 10 is a circuit diagram illustrating a configuration example of a class-$E^{-1}$ oscillator 91 according to a comparative example.

FIG. 10 is a circuit diagram illustrating a configuration example of the class-$E^{-1}$ oscillator 91 configuring an inverter circuit according to the comparative example. Referring to FIG. 10, the input voltage $V_I$ is applied to the drain of the MOS transistor Q1 via a high frequency removal inductor $L_{FRC}$ and the inductor $L_1$. The oscillation voltage generated by the MOS transistor Q1 is outputted to the load resistor $R_L$ via the inductor $L_1$, the capacitor $C_1$, and a parallel resonance filter 92 of an inductor $L_2$ and the capacitor $C_2$. In this case, an output voltage $v_o$ applied to a load resistor $R_L$ is expressed as an amplitude Vm by the following equation:

$$v_o(t) = Vm \sin(\theta + \varphi) \quad (1).$$

In this case, $\varphi$ is a phase difference between a gate voltage $v_g$ for the MOS transistor Q1 of a switching element and the output voltage $v_o$.

In the class-$E^{-1}$ oscillator 91, a capacitive component Cx included in the parallel resonance filter 92 is taken into consideration. Assuming that a current flowing through the capacitive component Cx is $I_{Cx}$, an input current is $I_I$, and an angular frequency is $\omega$, the current $I_{Cx}$ is expressed by the following equation:

$$I_{Cx} = \omega C x V_m = k_{V2} V_m + k_{I2} I_I \quad (2).$$

In this case, $k_{I2}$ is expressed by the following equation:

$$k_{I2} = \frac{1}{\pi \omega L_1} \left\{ \frac{\pi}{4q\omega C_1} \left[ \frac{\cos(q\pi + \phi) + \cos\phi}{q+1} + \frac{\cos(q\pi - \phi) + \cos\phi}{q-1} \right] - \right. \quad (3)$$

-continued
$$\left. \frac{\pi[1 + \cos(q\pi)]}{4q\omega C_1 \sin(q\pi)} \left[ \frac{\sin(q\pi + \phi) + \sin\phi}{q+1} + \frac{\sin(q\pi - \phi) + \sin\phi}{q-1} \right] \right\}.$$

In this case, q is expressed by the following equation:

$$q = \frac{1}{\omega\sqrt{L_1 C_1}}.$$

A DC input current $I_I$ flows by a series connection of a voltage source of the input voltage $V_I$ and the inductor $L_{RFC}$ of a choke coil. Since the input current $I_I$ is decided by the load resistor $R_L$, the input current $I_I$ changes due to the fluctuation in the load. From Equation (2), the following relational equation is established between the voltage amplitude Vm and the input current $I_I$:

$$Vm = \frac{k_{I2}}{\omega Cx - k_{V2}}. \quad (4)$$

In this case, in order for the output voltage $v_o(t)$ to be constant regardless of the fluctuation in the load, the following equation is a necessary condition:

$$\frac{\partial Vm}{\partial I_I} = 0. \quad (5)$$

From Equation (5), the equation is solved by using $k_{I2}=0$, and thus, the following equation is obtained:

$$\sin \varphi = 0 \quad (6).$$

In the circuit diagram of FIG. 10, since the output voltage $v_o$ is defined as a sign when the ground side is positive, in the present embodiment in which the output voltage $v_o$ is inverted and the ground side is defined as negative, the electrical characteristics independent of the load are obtained in the case of the phase difference of 180 degrees.

Figure 11A:
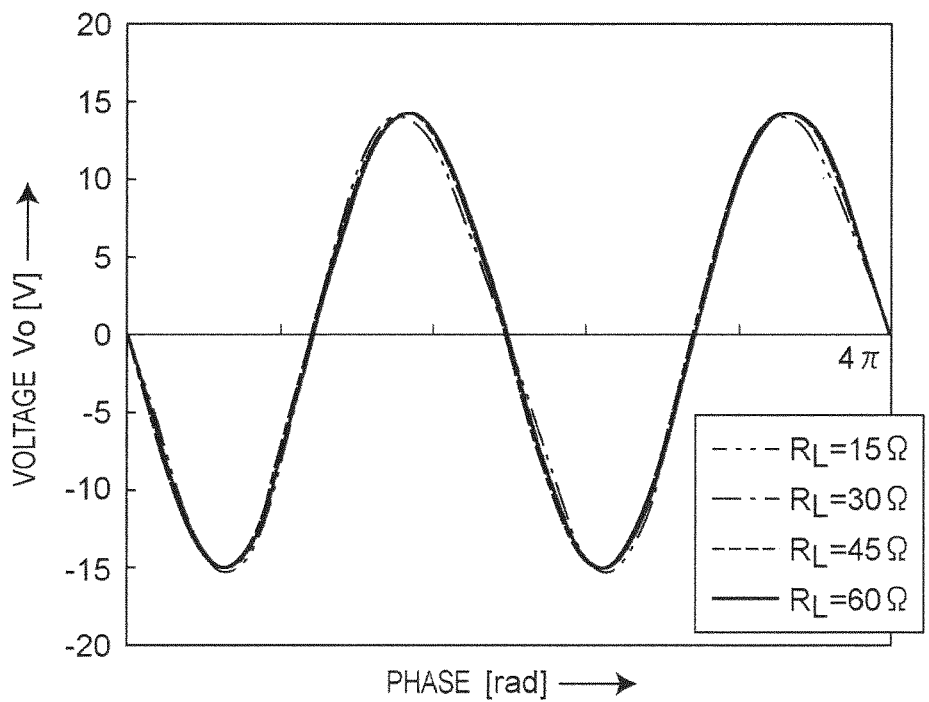
FIG. 11A is a waveform diagram of an output voltage Vo illustrating a simulation result of the resonance oscillator circuit 12-1 of FIG. 7A.
Figure 11B:
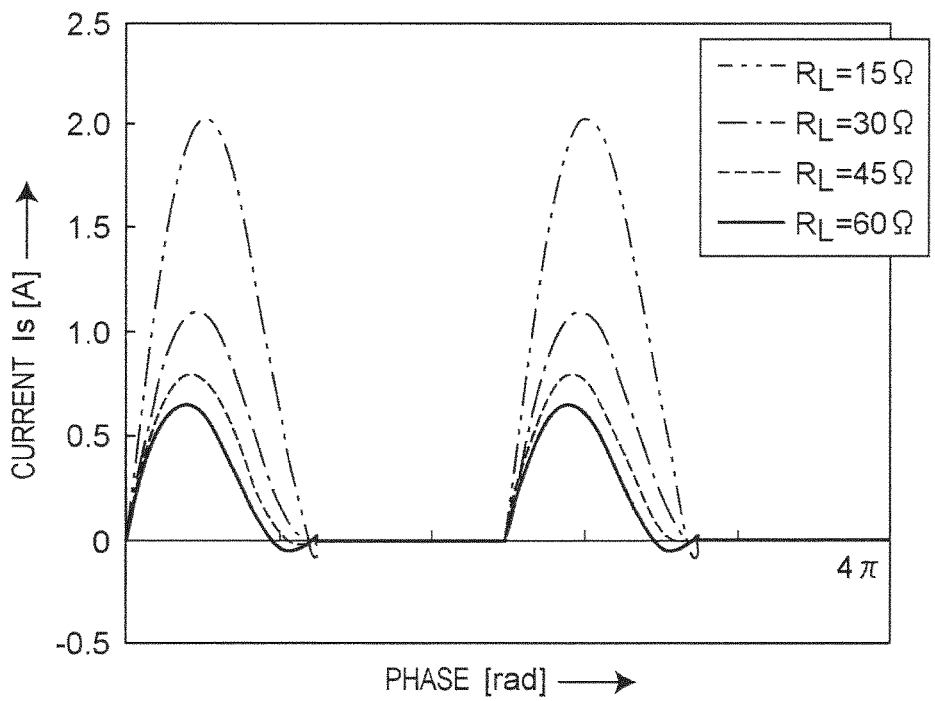
FIG. 11B is a waveform diagram of a source current Is illustrating the simulation result of the resonance oscillator circuit 12-1 of FIG. 7A.
Figure 11C:
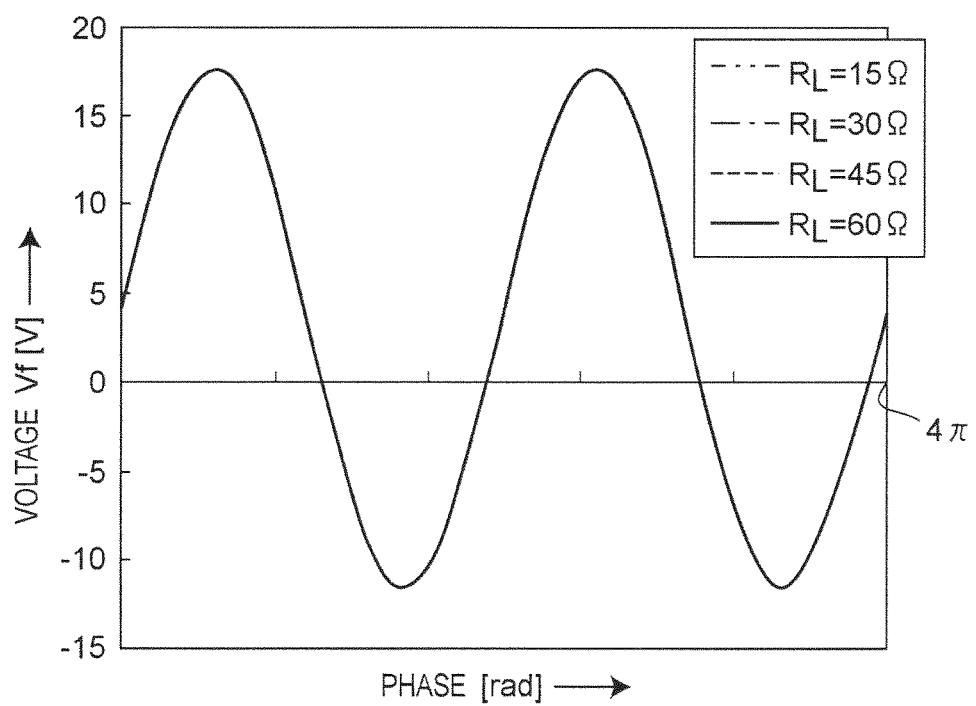
FIG. 11C is a waveform diagram of a feedback voltage Vf illustrating the simulation result of the resonance oscillator circuit 12-1 of FIG. 7A.

FIG. 11A is a waveform diagram of the output voltage Vo illustrating a simulation result of the resonance oscillator circuit 12-1 of FIG. 7A, FIG. 11B is a waveform diagram of a source current Is illustrating the simulation result of the resonance oscillator circuit 12-1 of FIG. 7A, and FIG. 11C is a waveform diagram of the feedback voltage Vf illustrating the simulation result of the resonance oscillator circuit 12-1 of FIG. 7A.

Figure 9A:
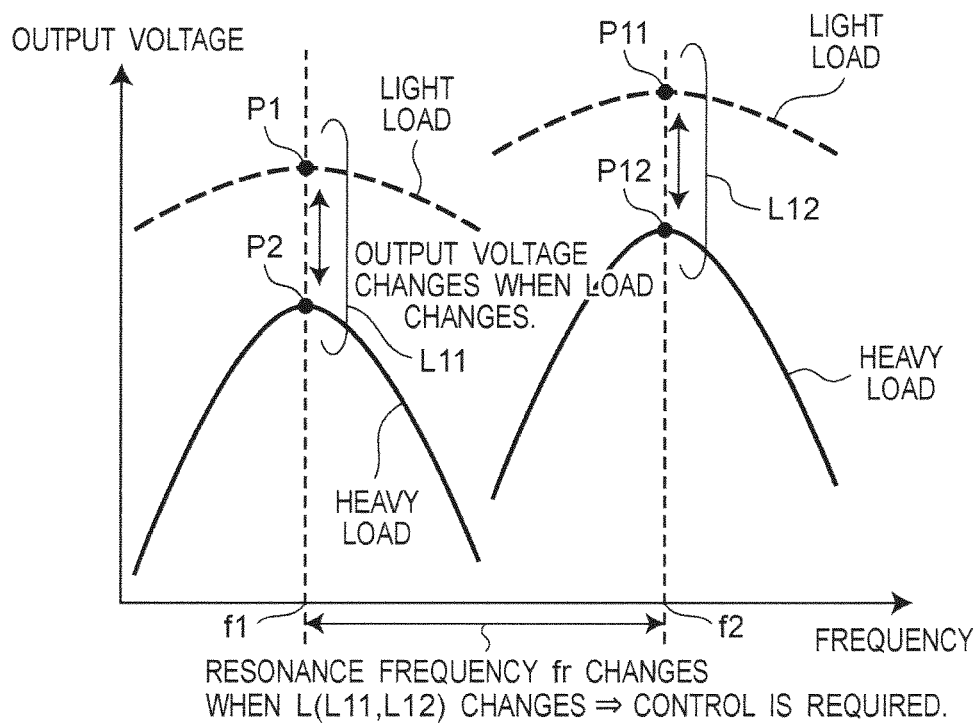
FIG. 9A is a graph representing output voltage characteristics for a frequency indicating an operation when the oscillator of the comparative example is used.
Figure 9B:
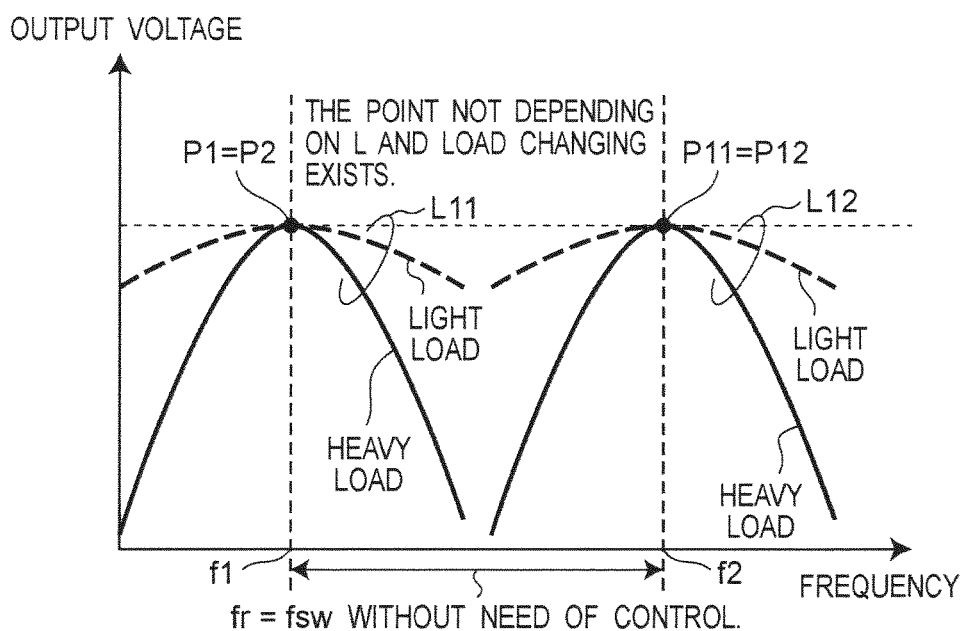
FIG. 9B is a graph representing output voltage characteristics for a frequency indicating an operation when the resonance oscillator circuit 12-1 of FIG. 7A is used.

As is apparent from FIGS. 11A to 11C, it can be seen that the output voltage Vo of the resonance oscillator circuit 12-1 does not fluctuate regardless of the load resistor $R_L$. That is, as illustrated in FIG. 9B, an operation point of the output voltage Vo does not fluctuate even though the inductance and the load resistor $R_L$ fluctuate (regardless of whether the load is light or heavy).

Figure 7B:
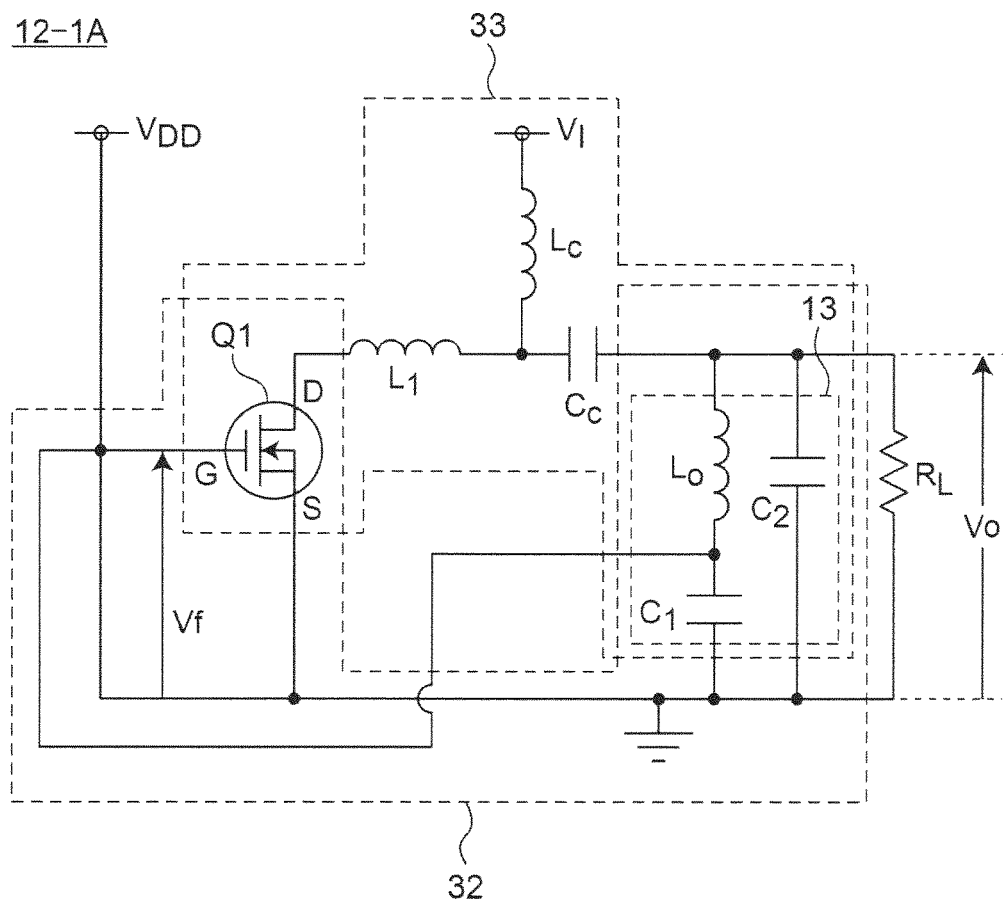
FIG. 7B is a circuit diagram illustrating a configuration example of a resonance oscillator circuit 12-1A according to a modified embodiment of the first implemental example.

FIG. 7B is a circuit diagram illustrating a configuration example of a resonance oscillator circuit 12-1A according to a first modified embodiment of the first implemental example. Although it has been illustrated in FIG. 7 that only the input voltage $V_I$ is used, the power supply voltage $V_{DD}$ and the input voltage $V_I$ may be used as illustrated in FIG. 7B. The gist of this modified embodiment is also applicable to second to sixth implemental examples to be described later. The resonance oscillator circuit 12-1A of FIG. 7B differs from the resonance oscillator circuit 12-1 of FIG. 7A in the following points.

(1) The DC bias circuit 31 is not provided, and the power supply voltage $V_{DD}$ (which may be an external voltage or the like) is applied to the gate of the MOS transistor Q1. It is noted that, the gate voltage Vf of the gate signal Vgs that drives the MOS transistor Q1 is fed back from the connection point between the inductor Lo and the capacitor $C_1$ to the gate that is the input terminal of the MOS transistor Q1.

(2) The input voltage $V_I$ is applied to the drain of the MOS transistor Q1 via the inductors Lc and $L_1$.

As described above, in accordance with the first embodiment and the modified embodiment, the resonance oscillator circuit 12 includes the Colpitis oscillator 32, the class-$E^{-1}$ oscillator 33, and the DC bias circuit 31 (used only in the first embodiment). Accordingly, a constant output voltage Vo can be obtained regardless of the inductance of the inductor Lo of the LC resonator circuit 13 and the load resistor $R_L$. Further, the switching frequency $f_{sw}$ does not need to be controlled by the change of the resonance frequency $f_r$ caused by the change of the inductance, and the frequencies $f_r$ and $f_{sw}$ can be fixed at constant values. Accordingly, the above-described Problems 1 and 2 can be solved.

In addition, zero voltage switching (ZVS) or zero current switching (ZCS) can be achieved regardless of the fluctuation in the load resistor $R_L$, and high efficiency can be achieved.

Further, for example, when the resonance oscillator circuit 12-1 of FIG. 7A is applied to the contactless power supply system, since it is not necessary to transmit the load information on the load current and the load voltage from the power reception apparatus 200 to the power transmission apparatus 100, it is not necessary to control the switching frequency $f_{sw}$ of the PFC circuit 11 of the power transmission apparatus 100 according to the resonance frequency $f_r$, and volumes of a control load and an apparatus circuit can be significantly reduced. Accordingly, in the first embodiment, the wireless communication circuits 15 and 25 between the power transmission and reception used for controlling the power transmission apparatus 100 and the DC/DC converter 23 of the power reception apparatus 200 may not be required.

In addition, for example, when the resonance oscillator circuit such as the resonance oscillator circuit 12-1 of FIG. 7A is applied to the contactless power supply system, the above-described phase difference independent of the load is set to a value independent of the inductance of the inductor Lo of the LC resonator circuit 13, the inductance of the power receiving LC resonator circuit 21, and the load resistor $R_L$ (this setting applies to all first to fourth embodiments and modified embodiments). Accordingly, the constant output voltage Vo can be obtained regardless of the inductance of the inductor Lo of the LC resonator circuit 13, the inductance of the power receiving LC resonator circuit 21, and the load resistor $R_L$. Further, the switching frequency fsw does not need to be controlled by the change of the resonance frequency $f_r$ caused by the change of the inductance, and the frequencies $f_r$ and $f_{sw}$ can be fixed at constant values. Accordingly, the above-described Problems 1 and 2 can be solved.

Next, the second to fourth embodiments which are other embodiments of the contactless power supply system according to the first embodiment of FIG. 1 will be described below.

Second Embodiment

Figure 2:
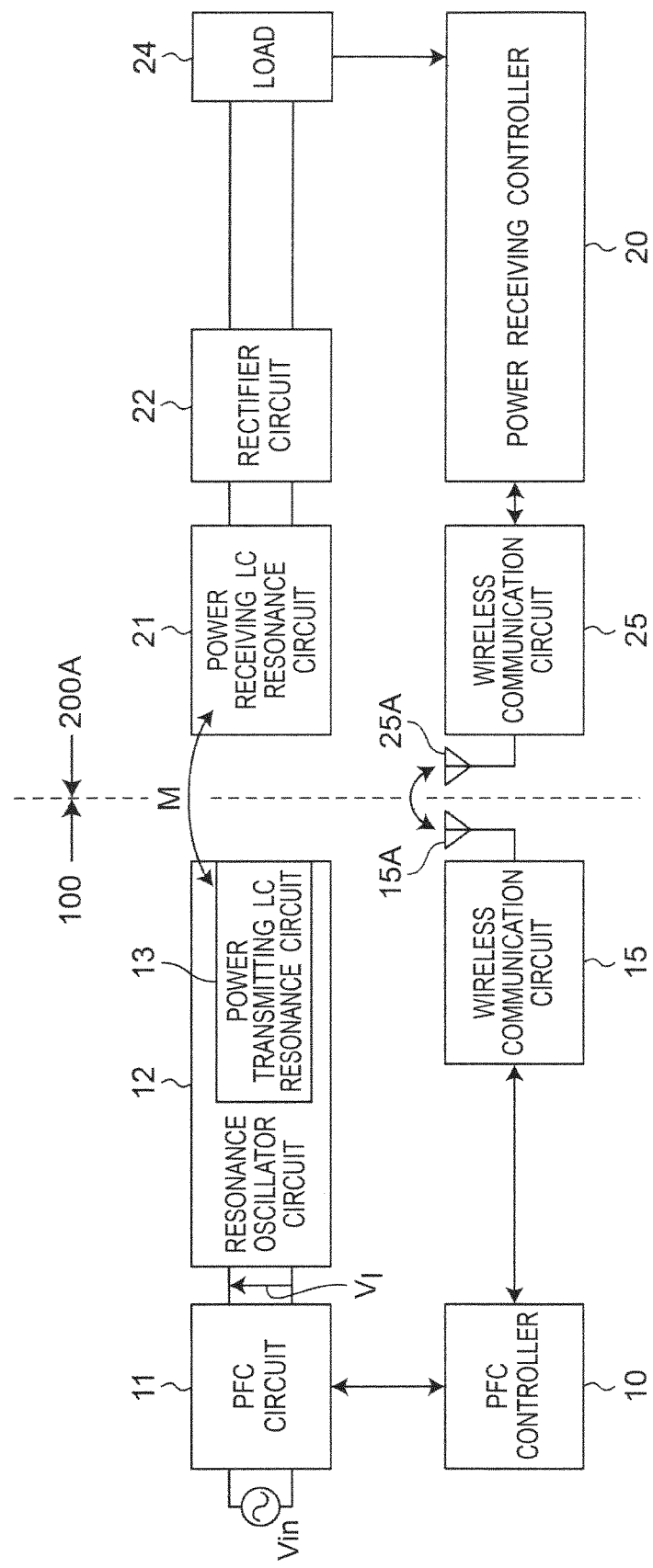
FIG. 2 is a block diagram illustrating a configuration example of a contactless power supply system according to a second embodiment.

FIG. 2 is a block diagram illustrating a configuration example of a contactless power supply system according to the second embodiment. The contactless power supply system according to the second embodiment of FIG. 2 differs from the contactless power supply system according to the first embodiment of FIG. 1 in the following points.

(1) A power reception apparatus 200A is provided in place of the power reception apparatus 200.

(2) The power reception apparatus 200A does not include the DC/DC converter 23 as compared with the power reception apparatus 200. Accordingly, a DC voltage from a rectifier circuit 22 is outputted to a load 24. In addition, a power receiving controller 20 does not need to control the DC/DC converter 23.

The contactless power supply system according to the second embodiment having the aforementioned configuration has the same functions and effects as those of the contactless power supply system according to the first embodiment except for the above-described differences.

Third Embodiment

Figure 3:
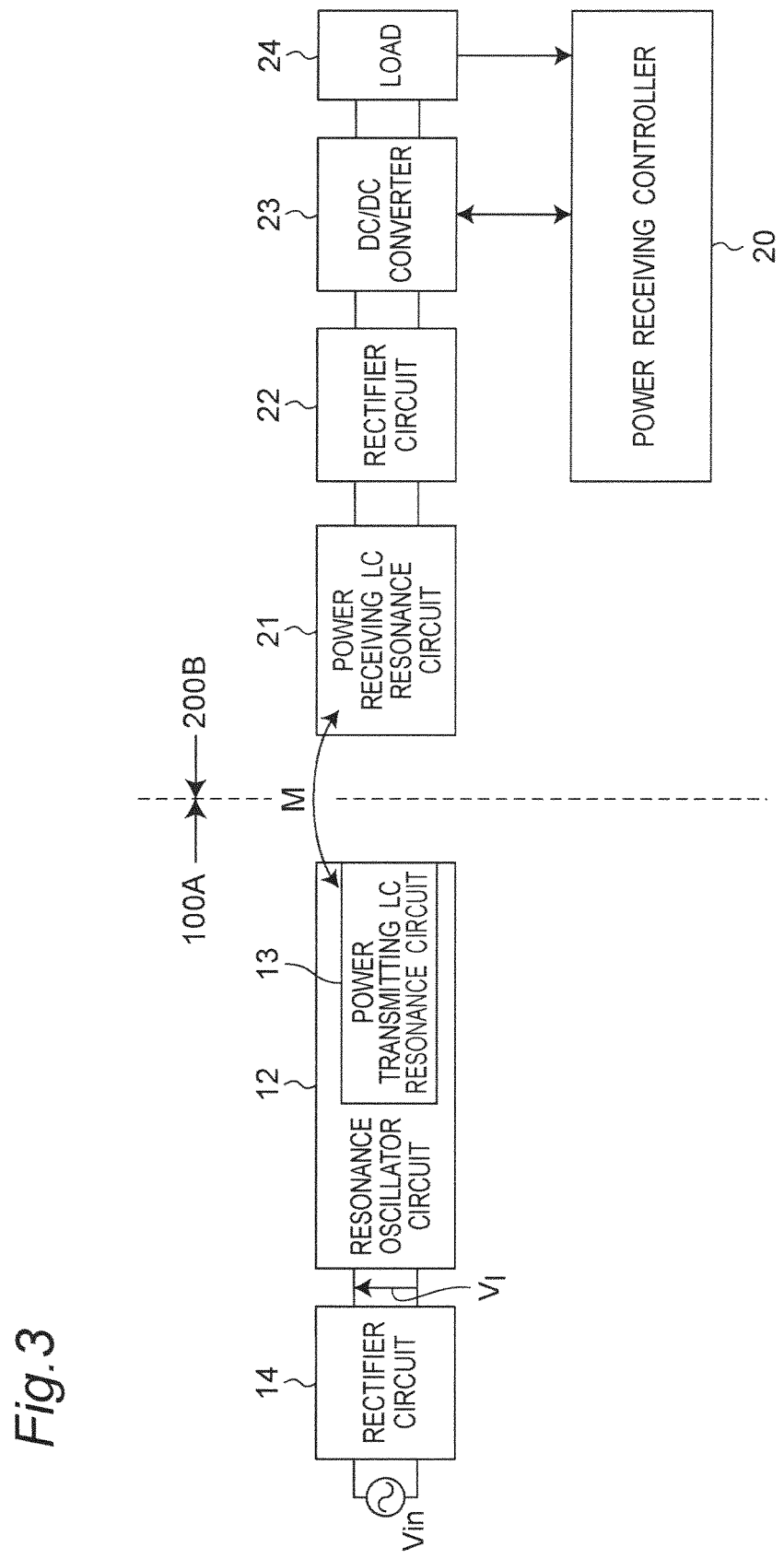
FIG. 3 is a block diagram illustrating a configuration example of a contactless power supply system according to a third embodiment.

FIG. 3 is a block diagram illustrating a configuration example of a contactless power supply system according to the third embodiment. The contactless power supply system according to the third embodiment of FIG. 3 differs from the contactless power supply system according to the first embodiment of FIG. 1 in the following points.

(1) A power transmission apparatus 100A is provided in place of the power transmission apparatus 100.

(2) The power transmission apparatus 100A includes a rectifier circuit 14 instead of the PFC circuit 11, and does not include the PFC controller 10 and the wireless communication circuit 15 as compared with the power transmission apparatus 100. The rectifier circuit 14 rectifies an AC voltage from an AC power supply to a DC voltage, and outputs the DC voltage to a resonance oscillator circuit 12.

(3) A power reception apparatus 200B is provided in place of the power reception apparatus 200.

(4) The power reception apparatus 200B does not include the wireless communication circuit 25 as compared with the power reception apparatus 200. In this case, a power receiving controller 20 controls only an operation of a DC/DC converter 23 based on load information for a load 24.

The contactless power supply system according to the third embodiment having the aforementioned configuration has the same functions and effects as those of the contactless power supply system according to the first embodiment except for the above-described differences.

Fourth Embodiment

Figure 4:
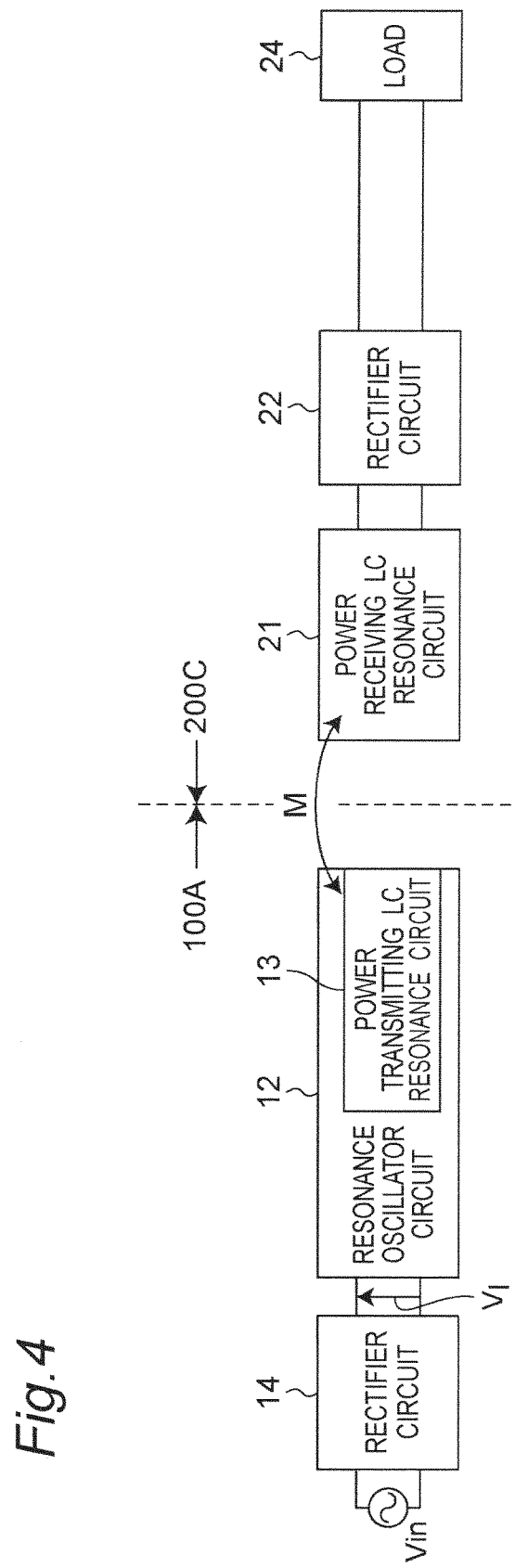
FIG. 4 is a block diagram illustrating a configuration example of a contactless power supply system according to a fourth embodiment.

FIG. 4 is a block diagram illustrating a configuration example of a contactless power supply system according to the fourth embodiment. The contactless power supply system according to the fourth embodiment of FIG. 4 differs from the contactless power supply system according to the first embodiment of FIG. 1 in the following points.

(1) The same power transmission apparatus 100A as that of the third embodiment is provided instead of the power transmission apparatus 100.

(2) A power reception apparatus 200C is provided in place of the power reception apparatus 200.

(3) The power reception apparatus 200C does not have the DC/DC converter 23, the power receiving controller 20, and the wireless communication circuit 25 as compared with the power reception apparatus 200. Accordingly, a DC voltage from a rectifier circuit 22 is outputted to a load 24.

The contactless power supply system according to the fourth embodiment having the aforementioned configuration has the same functions and effects as those of the contactless power supply system according to the first embodiment except for the above-described differences.

Next, resonance oscillator circuits 12-2 to 12-6 according to the second to sixth implemental examples different from the first implemental example which are applicable to the resonance oscillator circuits 12 according to the first to fourth embodiments will be described below.

Second Implemental Example

Figure 12:
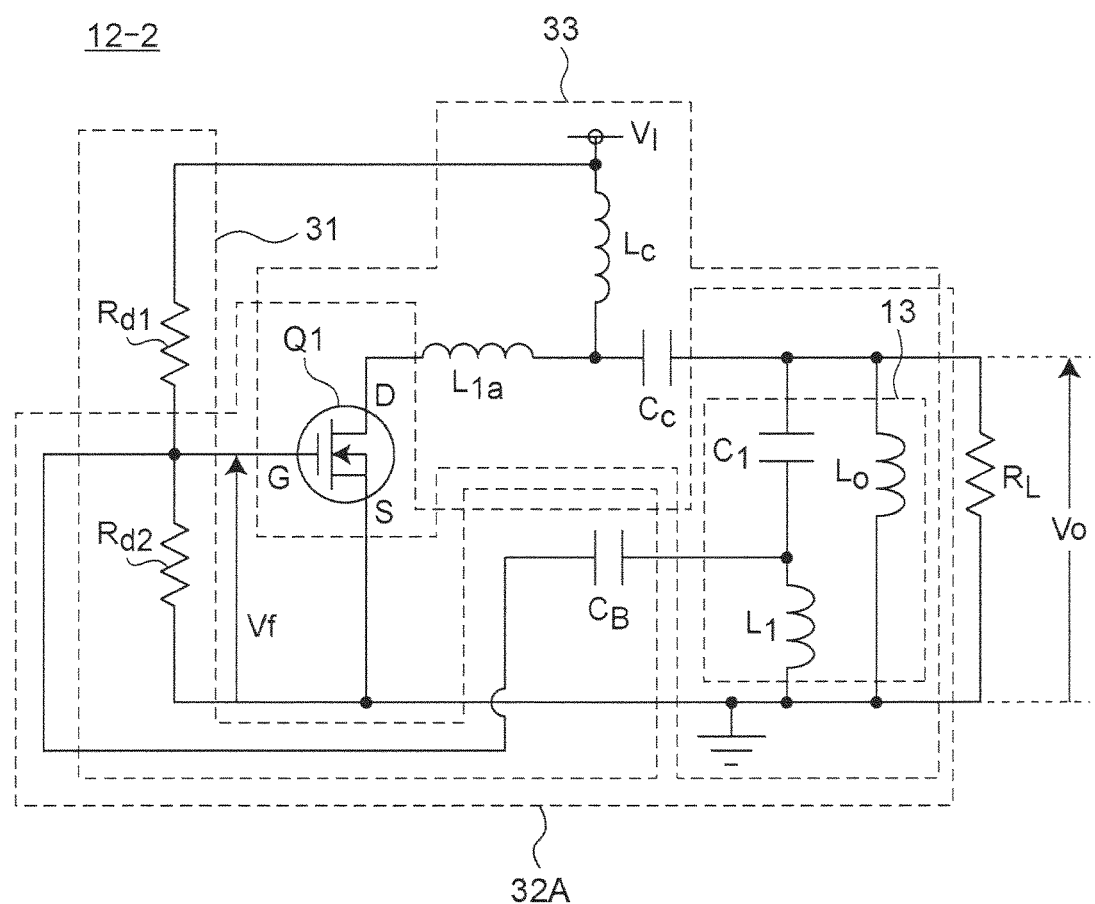
FIG. 12 is a circuit diagram illustrating a configuration example of a resonance oscillator circuit 12-2 according to a second implemental example.

FIG. 12 is a circuit diagram illustrating a configuration example of the resonance oscillator circuit 12-2 according to the second implemental example. The resonance oscillator circuit 12-2 according to the second implemental example of FIG. 12 differs from the resonance oscillator circuit 12-1 according to the first implemental example of FIG. 7A in the following points.

(1) A Hartley oscillator 32A is provided in place of the Colpitts oscillator 32. Hereinafter, the differences will be described in detail.

Referring to FIG. 12, the Hartley oscillator 32A includes a MOS transistor Q1, a voltage-dividing resistor $R_{d2}$, a feedback capacitor $C_B$, and an LC resonator circuit 13. In addition, a class-$E^{-1}$ oscillator 33 includes the MOS transistor Q1, inductors Lc and $L_{1a}$, a capacitor Cc, and the LC resonator circuit 13.

In this case, an input voltage $V_I$ is applied to a drain of the MOS transistor Q1 via inductors $L_c$ and $L_{1a}$. The LC resonator circuit 13 is configured by including a series circuit of a capacitor $C_1$ and an inductor $L_1$ and a parallel circuit of an inductor Lo. In this case, a connection point between the capacitor $C_1$ and the inductor $L_1$ is connected to a gate of the MOS transistor Q1 via the capacitor $C_B$ for DC cut coupling.

In a manner similar to that of the Colpitts oscillator 32, the Hartley oscillator 32A includes the LC resonator circuit 13 and the MOS transistor Q1, and oscillates by inverting a phase of an output voltage and feeding the output voltage back to the MOS transistor Q1. An oscillation frequency (resonance frequency) $f_r$ of the Hartley oscillator 32A of FIG. 12 is expressed by the following equation:

$$f_r = \frac{1}{2\pi\sqrt{(L_o + L_1)C_1}}.$$

In the Hartley oscillator 32A, since a connection point between the inductors Lo and $L_1$ can be grounded, a phase difference can be set to 180 degrees by setting Lo=$L_1$. When the phase difference is set to a value other than 180 degrees, Lo≠$L_1$ may be set. In this case, since the capacitively coupled capacitor $C_1$ and the grounded resonance inductor $L_1$ are included, the LC resonator circuit can be used, for example, in a capacitive coupling type contactless power supply system.

In the resonance oscillator circuit 12-2 having the aforementioned configuration, as illustrated in FIG. 12, an output voltage Vo which is a resonance waveform is detected, and a gate voltage Vf of a gate signal generates by shifting (that is, inverting) a phase by 180 degrees while maintaining an identical frequency. Accordingly, even though the resonance frequency $f_r$ fluctuates due to a change in an inductance of the inductor Lo, a switching frequency automatically follows the resonance frequency $f_r$, and output voltage characteristics independent of fluctuations in the inductance of the inductor Lo of the LC resonator circuit 13 and the load can be obtained. It is noted that, the phase difference may be set to a phase difference other than 180 degrees for achieving the load independence, as will be described in detail later.

Third Implemental Example

Figure 13:
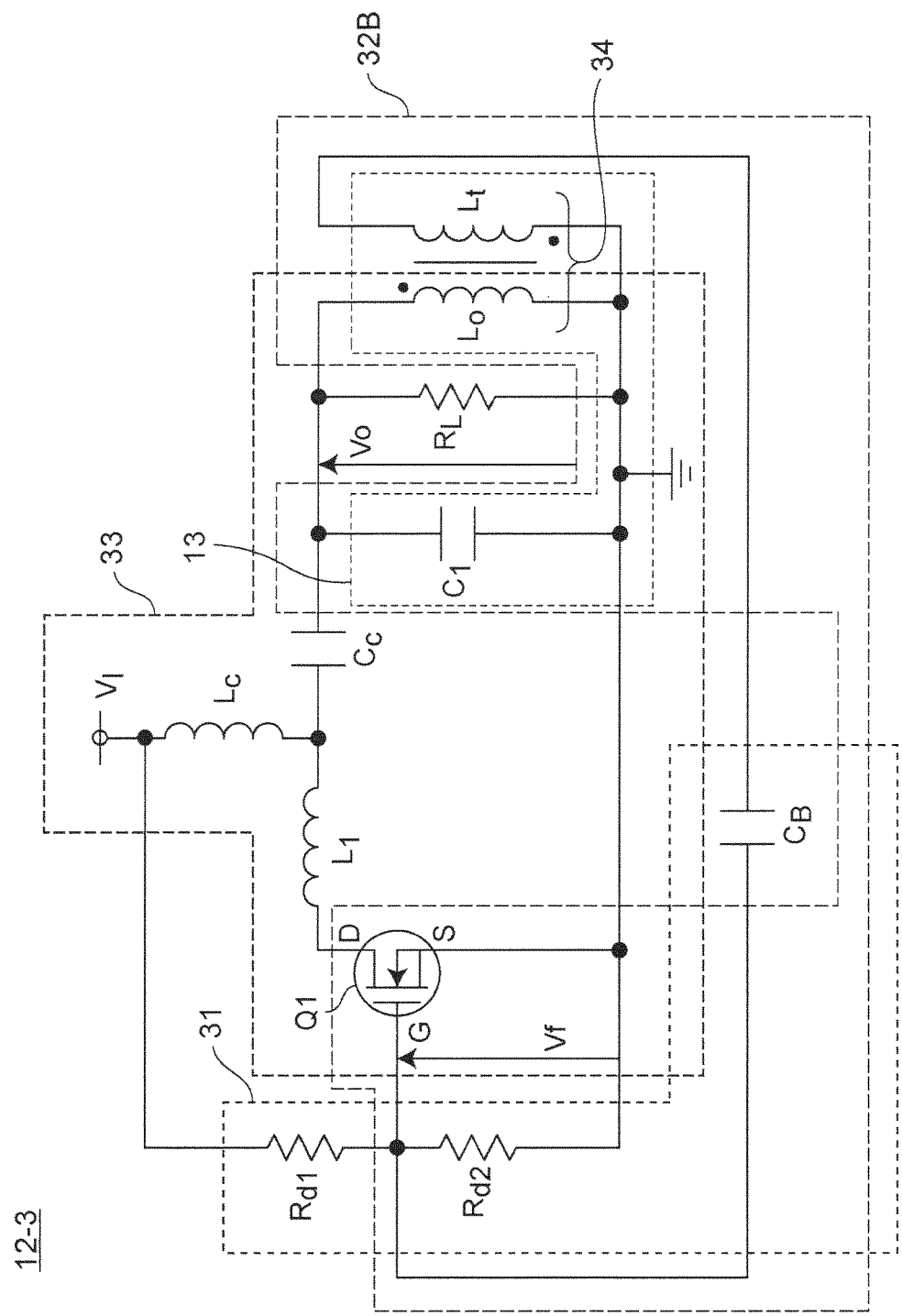
FIG. 13 is a circuit diagram illustrating a configuration example of a resonance oscillator circuit 12-3 according to a third implemental example.

FIG. 13 is a circuit diagram illustrating a configuration example of the resonance oscillator circuit 12-3 according to the third implemental example. The resonance oscillator circuit 12-3 according to the third implemental example of FIG. 13 differs from the resonance oscillator circuit 12-1 according to the first implemental example of FIG. 7A in the following points.

(1) A back-coupling oscillator 32B is provided in place of the Colpitts oscillator 32. Hereinafter, the differences will be described in detail.

Referring to FIG. 13, the resonance oscillator circuit 12-3 includes the following:

(1) a back-coupling oscillator 32B that includes an LC resonator circuit 13 and a MOS transistor Q1 of an amplifier element, and oscillates by shifting a phase of an output voltage with a predetermined phase difference and feeding the output voltage back to the MOS transistor Q1;

(2) a class-$E^{-1}$ oscillator 33 that oscillates by generating a gate voltage Vf of a gate signal Vgs, which has a frequency identical to that of an output voltage Vo and drives the MOS transistor Q1, by shifting a phase of the output voltage Vo with the phase difference to feed the gate voltage back to a certain gate, which is an input terminal of the MOS transistor Q1, by using the MOS transistor Q1 as a switching element and the back-coupling oscillator 32B as a feedback circuit; and (3) a DC bias circuit 31 that is capable of switching the MOS transistor Q1 by the gate signal Vgs based on the input voltage $V_I$, generates a predetermined DC bias voltage, and applies the DC bias voltage to a gate of the MOS transistor Q1.

(4) The phase difference is a value set not to substantially depend on a load resistor $R_L$ to which an output voltage Vo is applied, and is 180 degrees in the resonance oscillator circuit 12-3 of FIG. 13.

(5) The LC resonator circuit 13 includes a series circuit of an inductor Lo and a capacitor $C_1$ and an inductor Lt back-coupled to the inductor Lo. In this case, the inductors Lo and Lt configure a back-coupling transformer 34. It is noted that, the inductor Lo is electromagnetically coupled to an inductor of the power receiving LC resonator circuit 21 of the power reception apparatus 200.

Referring to FIG. 13, the back-coupling oscillator 32B includes the MOS transistor Q1, a voltage-dividing resistor $R_{d2}$, a feedback capacitor $C_B$, and the LC resonator circuit 13. In addition, the class-$E^{-1}$ oscillator 33 includes the MOS transistor Q1, inductors Lc and $L_1$, a capacitor Cc, and the LC resonator circuit 13.

In this case, the input voltage $V_I$ is applied to the gate of the MOS transistor Q1 while being divided by the voltage-dividing resistors $R_{d1}$ and $R_{d2}$. The input voltage VI is also applied to a drain of the MOS transistor Q1 via the inductors $L_c$ and $L_1$. An oscillation voltage generated by the MOS transistor Q1 is outputted as a load voltage Vo to the load resistor $R_L$ via the inductor $L_1$, the capacitor Cc, and the LC resonator circuit 13. It is noted that, the output voltage Vo is applied as the gate voltage Vf of the gate signal to the gate of the MOS transistor Q1 via the back-coupling transformer 34 and the feedback capacitor $C_B$.

Figure 14A:
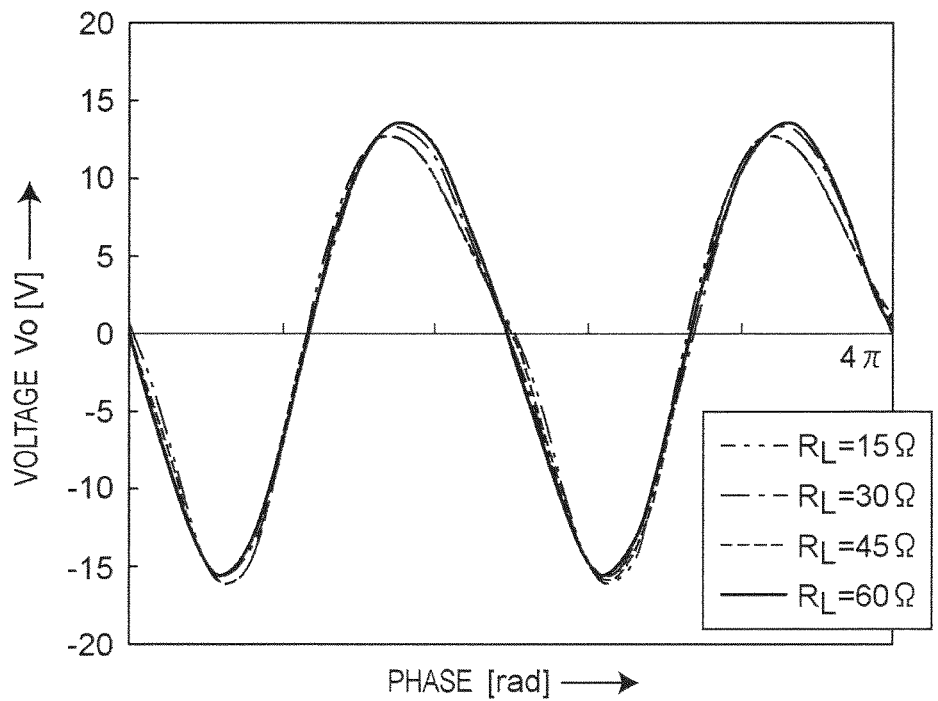
FIG. 14A is a waveform diagram of an output voltage Vo illustrating a simulation result of the resonance oscillator circuit 12-3 of FIG. 13.
Figure 14B:
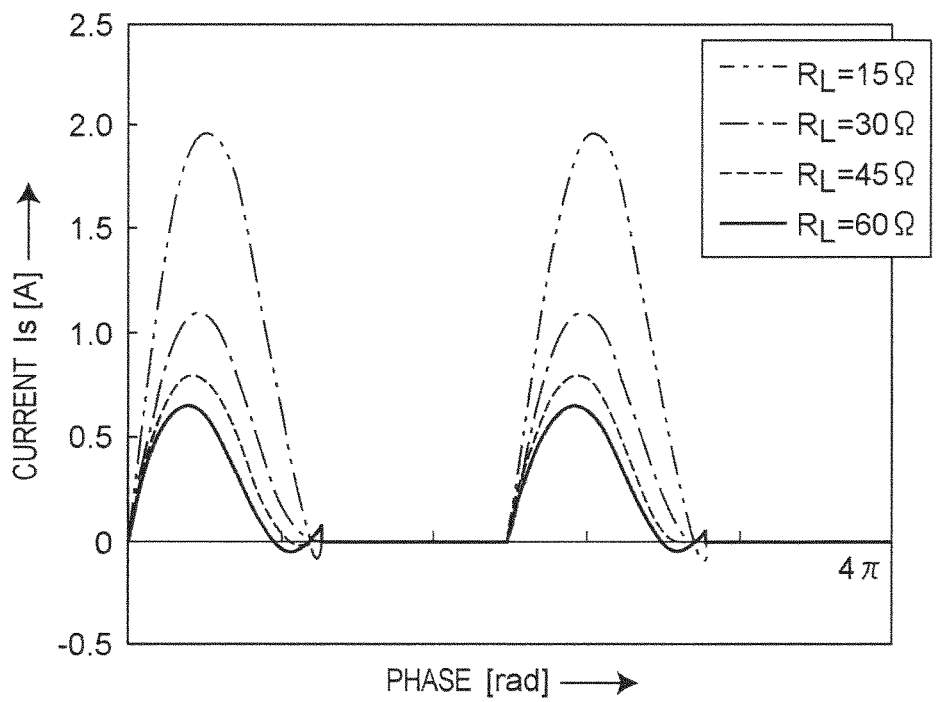
FIG. 14B is a waveform diagram of a source current Is illustrating the simulation result of the resonance oscillator circuit 12-3 of FIG. 13.
Figure 14C:
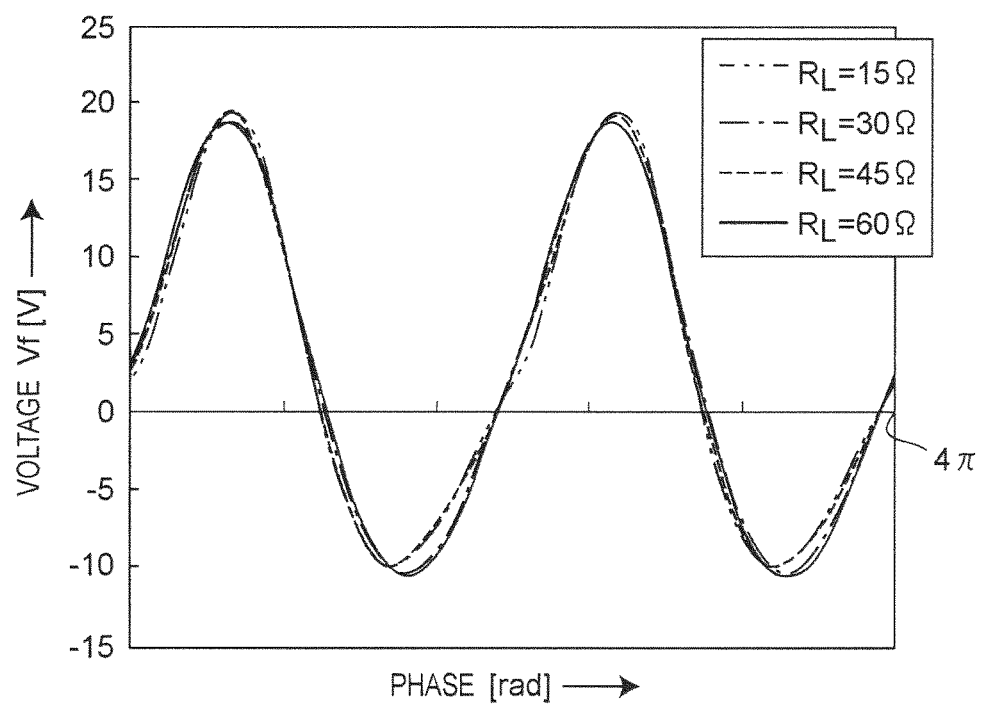
FIG. 14C is a waveform diagram of a feedback voltage Vf illustrating the simulation result of the resonance oscillator circuit 12-3 of FIG. 13.

FIG. 14A is a waveform diagram of the output voltage Vo illustrating a simulation result of the resonance oscillator circuit 12-3 of FIG. 13, FIG. 14B is a waveform diagram of the source current Is illustrating the simulation result of the resonance oscillator circuit 12-3 of FIG. 13, and FIG. 14C is a waveform diagram of the feedback voltage Vf illustrating the simulation result of the resonance oscillator circuit 12-3 of FIG. 13.

As is apparent from FIGS. 14A to 14C, it can be seen that the output voltage Vo of the resonance oscillator circuit 12-3 does not fluctuate regardless of the load resistor $R_L$. That is, as illustrated in FIG. 9B, an operation point of the output voltage Vo does not fluctuate even though the inductance and the load resistor $R_L$ fluctuate (regardless of whether the load is light or heavy).

In the resonance oscillator circuit 12-3 having the aforementioned configuration, as illustrated in FIG. 13, the output voltage Vo which is the resonance waveform is detected, and the gate voltage Vf of the gate signal generates by shifting (that is, inverting) the phase by 180° while maintaining the identical frequency. Accordingly, even though the resonance frequency $f_r$ fluctuates due to a change in an inductance of the inductor Lo, a switching frequency automatically follows the resonance frequency $f_r$, and output voltage characteristics independent of fluctuations in the inductance of the inductor Lo of the LC resonator circuit 13 and the load can be obtained. It is noted that, the phase difference may be set to a phase difference other than 180 degrees for achieving the load independence, as will be described in detail later.

Fourth Implemental Example

Figure 15:
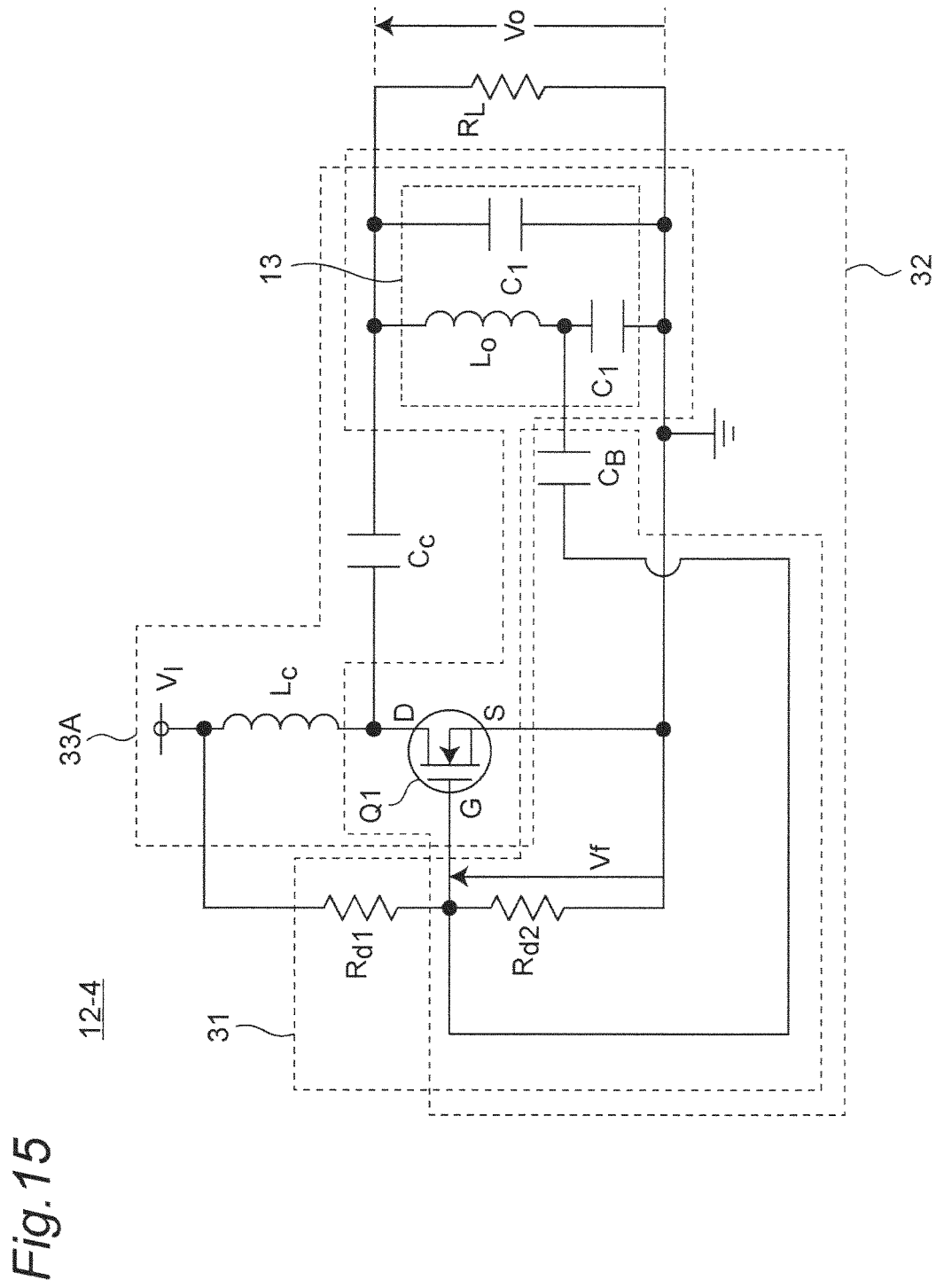
FIG. 15 is a circuit diagram illustrating a configuration example of a resonance oscillator circuit 12-4 according to a fourth implemental example.

FIG. 15 is a circuit diagram illustrating a configuration example of the resonance oscillator circuit 12-4 according to the fourth implemental example. The resonance oscillator circuit 12-4 according to the fourth embodiment differs from the resonance oscillator circuit 12-1 according to the first implemental example of FIG. 7A in the following points.

(1) A class-E oscillator 33A is provided in place of the class-$E^{-1}$ oscillator 33. That is, the resonance oscillator circuit 12-4 is characterized by including the class-E oscillator 33A, a Colpitts oscillator 32, and a DC bias circuit 31. Hereinafter, the differences will be described.

Referring to FIG. 15, the Colpitts oscillator 32 includes a MOS transistor Q1, a voltage-dividing resistor $R_{d2}$, a feedback capacitor CB, and an LC resonator circuit 13. In addition, the class-E oscillator 33A includes the MOS transistor Q1, an inductor Lc, a capacitor Cc, and the LC resonator circuit 13. In this case, an input voltage $V_I$ is applied to a drain of the MOS transistor Q1 via the inductor Lc. An oscillation voltage generated by the MOS transistor Q1 is outputted to a load resistor $R_L$ via the capacitor Cc and the LC resonator circuit 13. The other configurations are the same as those of FIG. 7A.

In the resonance oscillator circuit 12-4 having the aforementioned configuration, as illustrated in FIG. 15, an output voltage Vo which is a resonance waveform is detected, and a gate voltage Vf of a gate signal generates by shifting (that is, inverting) a phase by 180° while maintaining an identical frequency. Accordingly, even though the resonance frequency $f_r$ fluctuates due to a change in an inductance of the inductor Lo, a switching frequency automatically follows the resonance frequency $f_r$, and output voltage characteristics independent of fluctuations in the inductance of the inductor Lo of the LC resonator circuit 13 and the load can be obtained. It is noted that, the phase difference may be set to a phase difference other than 180 degrees for achieving the load independence, as will be described in detail later.

Fifth Implemental Example

Figure 16:
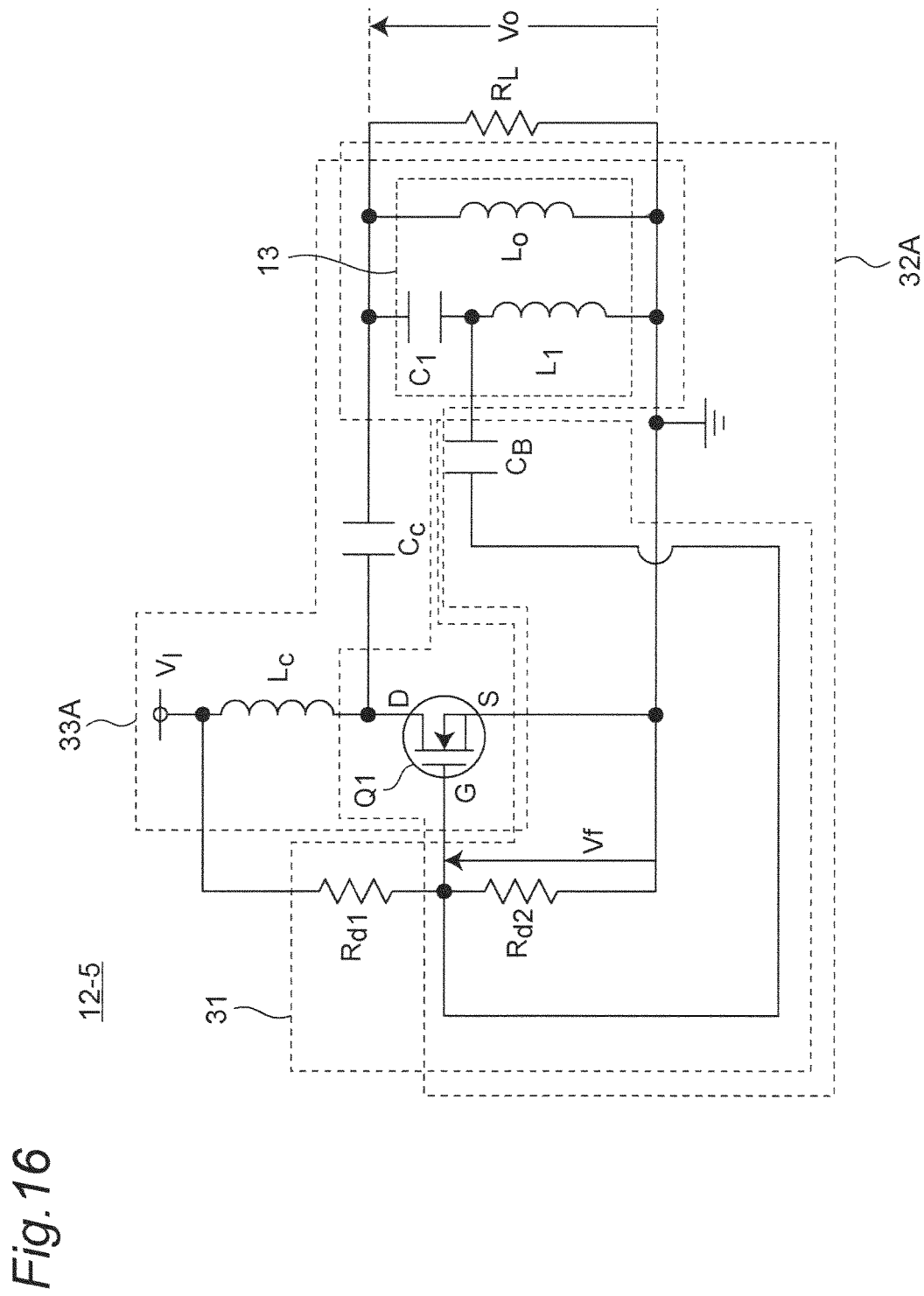
FIG. 16 is a circuit diagram illustrating a configuration example of a resonance oscillator circuit 12-5 according to a fifth implemental example.

FIG. 16 is a circuit diagram illustrating a configuration example of the resonance oscillator circuit 12-5 according to the fifth implemental example. The resonance oscillator circuit 12-5 according to the fifth implemental example differs from the resonance oscillator circuit 12-2 according to the second implemental example of FIG. 12 in the following points.

(1) A class-E oscillator 33A is provided in place of the class-$E^{-1}$ oscillator 33. That is, the resonance oscillator circuit 12-5 is characterized by including the class-E oscillator 33A, a Hartley oscillator 32A, and a DC bias circuit 31. Hereinafter, the differences will be described.

Referring to FIG. 16, the Hartley oscillator 32A includes a MOS transistor Q1, a voltage-dividing resistor $R_{d2}$, a feedback capacitor CB, and an LC resonator circuit 13. In addition, the class-E oscillator 33A includes the MOS transistor Q1, an inductor Lc, a capacitor Cc, and the LC resonator circuit 13. In this case, an input voltage $V_I$ is applied to a drain of the MOS transistor Q1 via the inductor Lc. An oscillation voltage generated by the MOS transistor Q1 is outputted to a load resistor $R_L$ via the capacitor Cc and the LC resonator circuit 13. The other configurations are the same as those in FIG. 12.

In the resonance oscillator circuit 12-5 having the aforementioned configuration, as illustrated in FIG. 16, an output voltage Vo which is a resonance waveform is detected, and a gate voltage Vf of a gate signal generates by shifting (that is, inverting) a phase by 180° while maintaining an identical frequency. Accordingly, even though the resonance frequency $f_r$ fluctuates due to a change in an inductance of the inductor Lo, a switching frequency automatically follows the resonance frequency $f_r$, and output voltage characteristics independent of fluctuations in the inductance of the inductor Lo of the LC resonator circuit 13 and the load can be obtained. It is noted that, the phase difference may be set to a phase difference other than 180 degrees for achieving the load independence, as will be described in detail later.

Sixth Implemental Example

Figure 17:
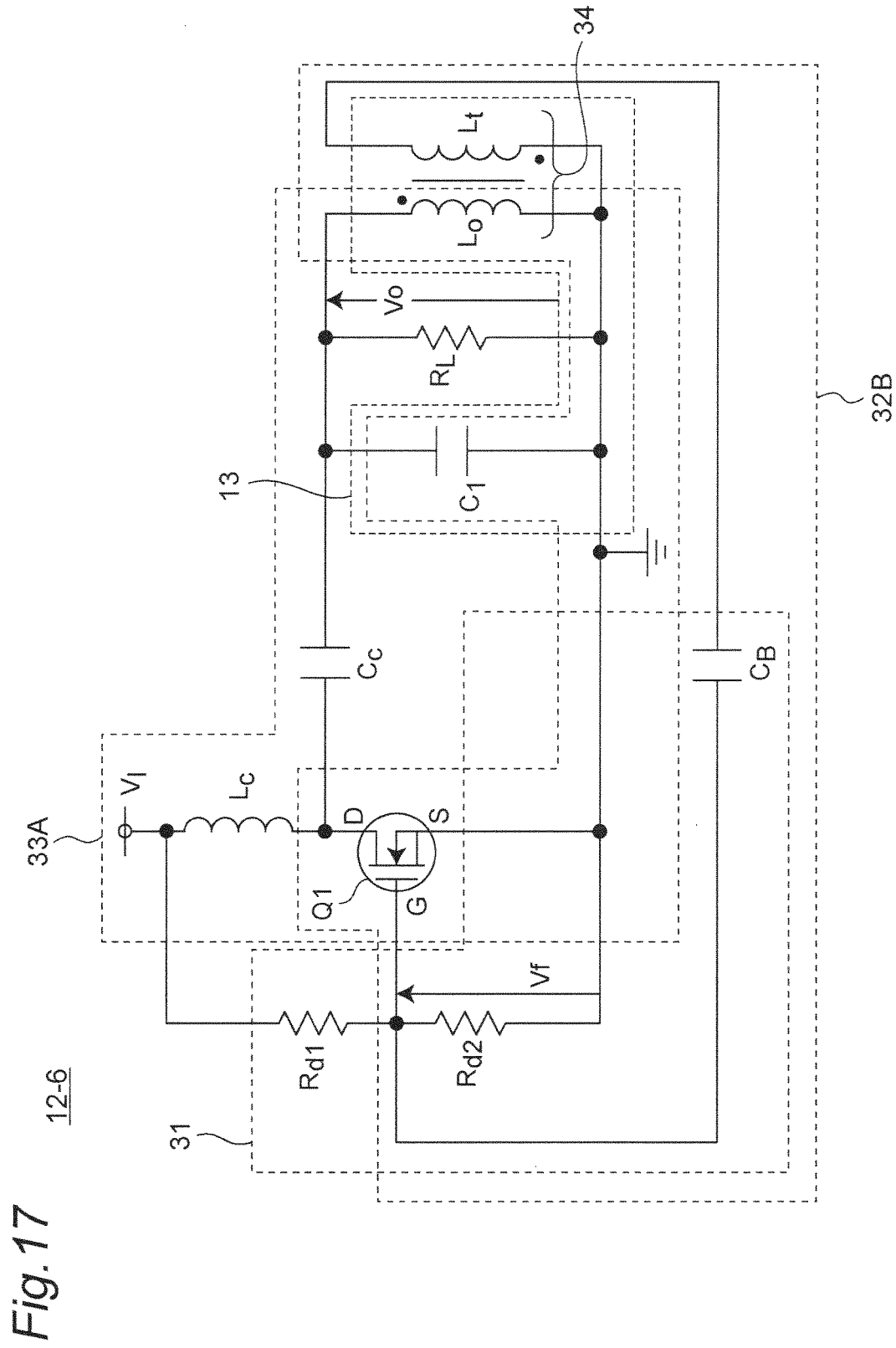
FIG. 17 is a circuit diagram illustrating a configuration example of a resonance oscillator circuit 12-6 according to a sixth implemental example.

FIG. 17 is a circuit diagram illustrating a configuration example of the resonance oscillator circuit 12-6 according to the sixth implemental example. The resonance oscillator circuit 12-6 according to the sixth implemental example differs from the resonance oscillator circuit 12-3 according to the third implemental example of FIG. 13 in the following points.

(1) A class-E oscillator 33A is provided in place of the class-$E^{-1}$ oscillator 33. That is, the resonance oscillator circuit 12-6 is characterized by including the class-E oscillator 33A, a back-coupling oscillator 32B, and a DC bias circuit 31. Hereinafter, the differences will be described.

Referring to FIG. 17, the back-coupling oscillator 32B includes a MOS transistor Q1, a voltage-dividing resistor $R_{d2}$, a feedback capacitor CB, and an LC resonator circuit 13. In addition, the class-E oscillator 33A includes the MOS transistor Q1, an inductor Lc, a capacitor Cc, and the LC resonator circuit 13. In this case, an input voltage $V_I$ is applied to a drain of the MOS transistor Q1 via the inductor Lc. An oscillation voltage generated by the MOS transistor Q1 is outputted to a load resistor $R_L$ via the capacitor Cc and the LC resonator circuit 13. The other configurations are the same as those in FIG. 13.

In the resonance oscillator circuit 12-6 having the aforementioned configuration, as illustrated in FIG. 17, an output voltage Vo which is a resonance waveform is detected, and a gate voltage Vf of a gate signal generates by shifting (that is, inverting) a phase by 180° while maintaining an identical frequency. Accordingly, even though the resonance frequency $f_r$ fluctuates due to a change in an inductance of the inductor Lo, a switching frequency automatically follows the resonance frequency $f_r$, and output voltage characteristics independent of fluctuations in the inductance of the inductor Lo of the LC resonator circuit 13 and the load can be obtained. It is noted that, the phase difference may be set to a phase difference other than 180 degrees for achieving the load independence, as will be described in detail later.

First Modified Embodiment

Figure 18:
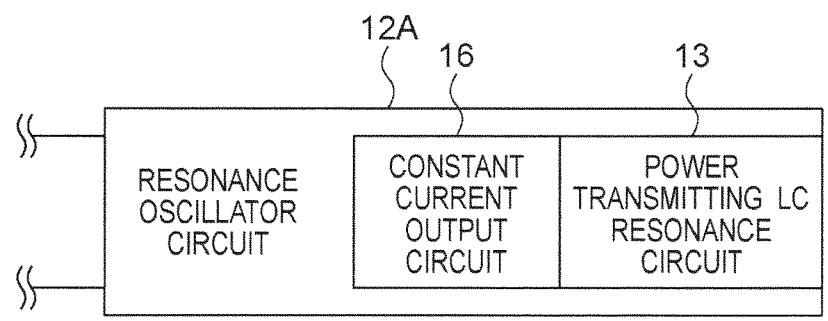
FIG. 18 is a block diagram illustrating a configuration example of a resonance oscillator circuit 12A according to a first modified embodiment.
Figure 19:
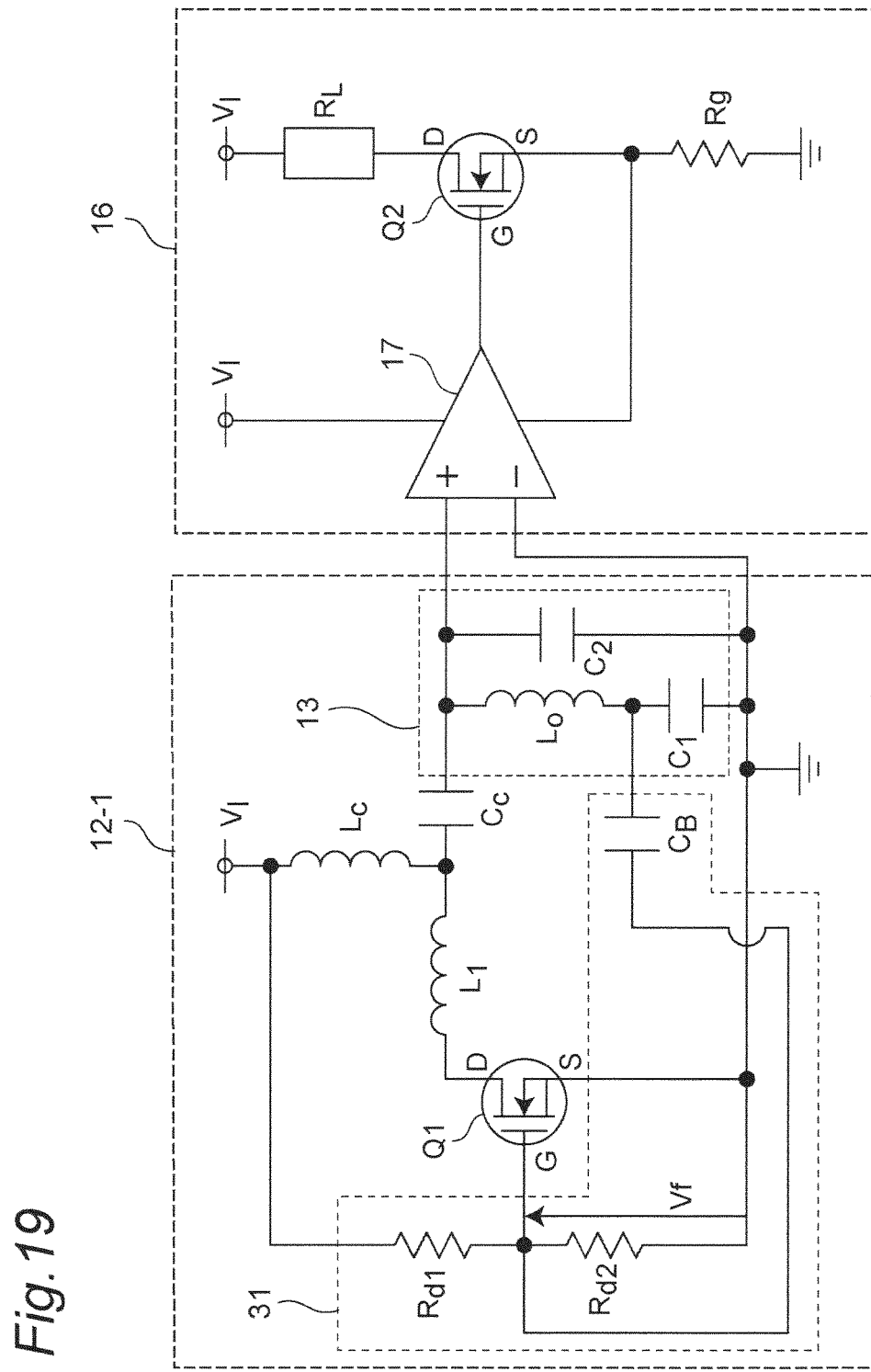
FIG. 19 is a circuit diagram illustrating a configuration example of a constant current output circuit 16 of FIG. 18.

FIG. 18 is a block diagram illustrating a configuration example of a resonance oscillator circuit 12A according to a first modified embodiment, and FIG. 19 is a circuit diagram illustrating a configuration example of a constant current output circuit 16 of FIG. 18. As illustrated in FIG. 18, the resonance oscillator circuit 12 according to each of the above-described embodiments may be the resonance oscillator circuit 12A including a constant current output circuit 16 that outputs a constant output current based on an input voltage regardless of the fluctuation in a load resistor $R_L$ located at a front stage of a power transmitting LC resonator circuit 13.

In the configuration example of FIG. 19, the constant current output circuit 16 includes an operational amplifier 17 and a MOS transistor Q2. Referring to FIG. 19, for example, the output voltage from a resonance oscillator circuit 12-1 is applied to a non-inverted output terminal and an inverting input terminal of the operational amplifier 17, and an output voltage from the operational amplifier 17 is outputted to a gate of the MOS transistor Q2. In this case, the positive power supply terminal of the operational amplifier 17 is connected to, for example, an input voltage $V_I$, the negative power supply terminal thereof is connected to a connection point between a source of the MOS transistor Q2 and a resistor Rg, and another terminal of the resistor Rg is grounded. Further, a drain of the MOS transistor Q2 is connected to, for example, the input voltage $V_I$ via the load resistor $R_L$.

The constant current output circuit 16 having the aforementioned configuration constitutes a known constant current circuit, and outputs a constant output current based on the input voltage regardless of the fluctuation in the load resistor $R_L$. Accordingly, the constant current output circuit 16 according to the first modified embodiment is used, and thus, the output current output to the power transmitting LC resonator circuit 13 can be controlled to a predetermined constant value even though a load after the power transmitting LC resonator circuit 13 fluctuates.

Second Modified Embodiment

Figure 20:
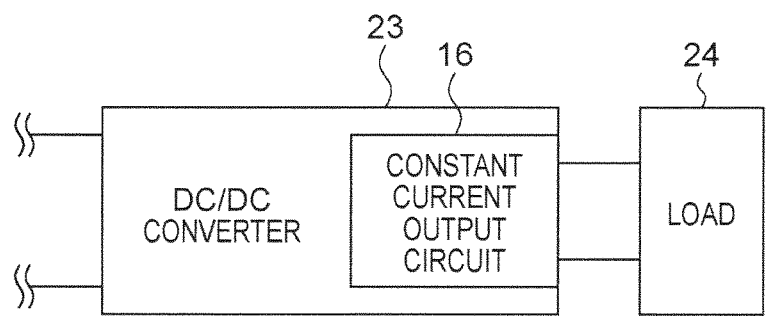
FIG. 20 is a block diagram illustrating a configuration example of a DC/DC converter 23 according to a second modified embodiment.

FIG. 20 is a block diagram illustrating a configuration example of a DC/DC converter 23 according to a second modified embodiment. As illustrated in FIG. 20, a constant current output circuit 16 of FIG. 19 may be provided at a subsequent stage of the DC/DC converter 23 between the DC/DC converter and a load 24. Accordingly, the constant current output circuit 16 according to the second modified embodiment is used, and thus, an output current output to the load 24 can be controlled to a predetermined constant value even though the load 24 fluctuates.

Other First Modified Embodiment

Although it has been described in the aforementioned embodiments and modified embodiments that the resonance oscillator circuit 12 or the like that oscillates by combining two oscillators and using the signal of which the output voltage Vo is inverted as the gate signal Vgs is used, the present invention is limited thereto. Resonance oscillator circuits 12, 12-1, 12-1A, and 12-2 to 12-6 that oscillate by combining two oscillators and using a signal of which the output voltage Vo is phase-shifted by a predetermined phase difference as the gate signal Vgs (hereinafter, referred to as the resonance oscillator circuit 12 or the like) may be prepared as follows.

After the resonance oscillator circuit 12 or the like which is an analog circuit in the embodiments or the modified embodiments is prepared, the phase difference is stored in a predetermined memory, and a zero cross point of a resonance waveform or an operation point at which dVo/dt is obtained is detected. By doing this, zero voltage switching or zero current switching can also be performed without depending on an inductance and a load resistor $R_L$. A method for calculating the phase difference independent of the load is as follows.

(1) The following equation of an output voltage Vo (or output current Io) from a condition of a duty ratio of the resonance oscillator circuit and a gate signal Vgs is obtained, and in this equation, a phase difference φ and the load resistor $R_L$ or a term that uniquely decides the load resistor $R_L$ are included:

$$Vo = \varphi \times R_L / Cx \quad (7).$$

(2) In the above Equation (6), in order for the output voltage Vo to be constant regardless of a value of the load resistor $R_L$, the condition in which the solution when the load resistor $R_L$ is partially differentiated is 0 as represented in the following equation is a necessary condition:

$$\partial Vo / \partial R_L = 0 \quad (8).$$

From the above equations (7) and (8), a phase difference $\varphi_d$ independent of the load can be obtained by the following equation:

$$\varphi = \varphi_d \quad (9).$$

That is, the resonance oscillator circuit 12 or the like that oscillates by combining two oscillators and using a signal of which an output voltage Vo is phase-shifted by a phase difference independent of the load as the gate signal Vgs may be prepared.

Other Second Modified Embodiment

The power transmitting LC resonator circuit 13 and the power receiving LC resonator circuit 21 may have at least the following configurations in place of the above-described LC resonator circuits.

(1) The power transmitting LC resonator circuit 13 of a power transmission apparatus 100 or 100A may include at least one inductor and at least one capacitor. That is, the power transmitting LC resonator circuit 13 may include one or a plurality of inductors and one or a plurality of capacitors, and may have a configuration in which these inductors and capacitors may be connected in series, in parallel, or in series and parallel.

(2) The power receiving LC resonator circuit 21 of the power reception apparatus 200, 200A, 200B, or 200C may include at least one inductor and at least one capacitor. That is, the power receiving LC resonator circuit 21 may include one or a plurality of inductors and one or a plurality of capacitors, and may have a configuration in which these inductors and capacitors may be connected in series, in parallel, or in series and parallel.

It is noted that, the coupling between the power transmitting LC resonator circuit 13 and the power receiving LC resonator circuit 21 is not limited to the inductive coupling, and may be a contactless wireless coupling such as electrolytic coupling or electromagnetic coupling.

Effects of Embodiments and Modified Embodiments

As described above, in accordance with the present embodiments and the modified embodiments, the circuit of the present invention is applied to the LC resonator circuit of the power transmission apparatus, and thus, there is a peculiar effect capable of reducing a part for controlling output characteristics (for example, a portion for controlling the switching frequency fsw of the inverter circuit, the DC/DC converter of the power reception apparatus, or the like).

INDUSTRIAL APPLICABILITY

The contactless power supply system according to the above-described embodiments are applicable to a power supply system for a mobile object such as an AGV or an EV, and a power supply system for a pallet on a production line. In addition, the present embodiments are also effective in an application in which a distance between the power transmission and reception does not change, and are applicable to, for example, a contactless slip ring of a contactless power supply apparatus used in place of a slip ring (rotating object) used for a robot arm or the like.

Further, the resonance oscillator circuits according to the above-described implemental examples are applicable to a power supply apparatus or the like using the LC resonator circuit, and even though values of the inductor and the capacitor do not match the design due to product variations or the like, a resonance frequency in an actual machine can be adjusted to a predetermined value corresponding to variations of the inductor value and/or the capacitor value.

What is claimed is:

1. A resonance oscillator circuit comprising:
  a first oscillator that includes a first LC resonator circuit and an amplifier element, and oscillates by shifting a phase of an output voltage with a predetermined phase difference and feeding a phase-shifted output voltage back to the amplifier element, the predetermined phase difference being determined to operate the first oscillator; and
  a second oscillator that oscillates by generating a gate signal, which has a frequency identical to that of the output voltage and drives the amplifier element, by shifting the phase of the output voltage with the predetermined phase difference and feeding the gate signal back to an input terminal of the amplifier element, by using the amplifier element as a switching element and using the first oscillator as a feedback circuit,
  wherein the predetermined phase difference is a value substantially independent of an inductance of the first LC resonator circuit and a load, to which the output voltage is applied,
  wherein the first oscillator is a Colpitts oscillator,
  wherein the second oscillator is any one of a class $E^{-1}$ oscillator and a class E oscillator, and
  wherein the first LC resonator circuit is a first parallel circuit of a first capacitor and a first series circuit including a second capacitor and a first inductor, which are connected in series to each other, and the phase-shifted output voltage is fed back from a connection point of the second capacitor and the first inductor to the amplifier element.

2. The resonance oscillator circuit as claimed in claim 1, further comprising a circuit that is capable of switching the amplifier element by the gate signal based on an input voltage, a circuit voltage, or an external voltage, generates a predetermined voltage, and applies the predetermined voltage to the input terminal of the amplifier element.

3. The resonance oscillator circuit as claimed in claim 1, wherein the amplifier element is a switching element.

4. The resonance oscillator circuit as claimed in claim 3, wherein the gate signal is a binary signal that turns on or off the switching element.

5. The resonance oscillator circuit as claimed in claim 1, further comprising a constant current output circuit that is provided at a front stage of the first LC resonator circuit, and control an output current of the resonance oscillator circuit to be a constant current based on an input voltage inputted after oscillated.

6. A contactless power supply system comprising:
  a power transmission apparatus comprising a resonance oscillator circuit; and
  a power reception apparatus,
  wherein the resonance oscillator circuit comprises:
  a first oscillator that includes a first LC resonator circuit and an amplifier element, and oscillates by shifting a phase of an output voltage with a predetermined phase difference and feeding phase-shifted output voltage back to the amplifier element the predetermined phase difference being determined to operate the first oscillator; and
  a second oscillator that oscillates by generating a gate signal, which has a frequency identical to that of the output voltage and drives the amplifier element, by shifting the phase of the output voltage with the predetermined phase difference and feeding the gate signal back to an input terminal of the amplifier element, by using the amplifier element as a switching element and using the first oscillator as a feedback circuit,
  wherein the predetermined phase difference is a value substantially independent of an inductance of the first LC resonator circuit and a load, to which the output voltage is applied,
  wherein the power reception apparatus comprises:
  a second LC resonator circuit that is coupled to the first LC resonator circuit, and receives an AC power from the first LC resonator circuit, and
  a first rectifier circuit that rectifies the AC power received by the second LC resonator circuit to a DC voltage, and outputs the DC voltage to a predetermined load, and
  wherein the predetermined phase difference is a value substantially independent of inductances of the first and second LC resonator circuits and a load, to which the output voltage is applied,
  wherein the first oscillator is a Colpitts oscillator, wherein the second oscillator is any one of a class $E^{-1}$ oscillator and a class E oscillator, and wherein the first LC resonator circuit is a first parallel circuit of a first capacitor and a first series circuit including a second capacitor and a first inductor, which are connected in series to each other, and the phase-shifted output voltage is fed back from a connection point of the second capacitor and the first inductor to the amplifier element.

7. The contactless power supply system as claimed in claim 6, wherein the power reception apparatus further comprises a DC/DC converter that is inserted between the first rectifier circuit and the load, and converts the DC voltage from the first rectifier circuit into a predetermined DC voltage.

8. The contactless power supply system as claimed in claim 7, wherein the DC/DC converter further comprises a constant current output circuit that is provided at a subsequent stage of the DC/DC converter, and outputs a constant output current to the load based on the converted DC voltage.

9. The contactless power supply system as claimed in claim 6, wherein the power transmission apparatus further comprises a second rectifier circuit that is provided at a front stage of the resonance oscillator circuit, rectifies a predetermined AC voltage to a DC voltage, and outputs the DC voltage to the resonance oscillator circuit.

10. The contactless power supply system as claimed in claim 6, wherein the power reception apparatus further comprises a power receiving controller that detects control information necessary for controlling at least one of an output voltage and an output current of the power reception apparatus, and wirelessly transmits the control information, and wherein the power transmission apparatus further comprises:

a power factor correction circuit that is provided at a front stage of the resonance oscillator circuit, and corrects a power factor by shaping a waveform of the output voltage based on a predetermined AC voltage, and a power factor correction circuit controller that wirelessly receives the control information wirelessly transmitted, and controls an operation of the power factor correction circuit based on the control information.

11. The contactless power supply system as claimed in claim 10, wherein the power reception apparatus further comprises a DC/DC converter that is inserted between the first rectifier circuit and the load, and converts the DC voltage from the first rectifier circuit into a predetermined DC voltage.

12. The contactless power supply system as claimed in claim 11, wherein the DC/DC converter further comprises a constant current output circuit that is provided at a subsequent stage of the DC/DC converter, and outputs a predetermined output current to the load based on the converted DC voltage.

13. A resonance oscillator circuit comprising:

a first oscillator that includes a first LC resonator circuit and an amplifier element, and oscillates by shifting a phase of an output voltage with a predetermined phase difference and feeding a phase-shifted output voltage back to the amplifier element, the predetermined phase difference being determined to operate the first oscillator; and a second oscillator that oscillates by generating a gate signal, which has a frequency identical to that of the output voltage and drives the amplifier element, by shifting the phase of the output voltage with the predetermined phase difference and feeding the gate signal back to an input terminal of the amplifier element, by using the amplifier element as a switching element and using the first oscillator as a feedback circuit, wherein the predetermined phase difference is a value substantially independent of an inductance of the first LC resonator circuit and a load, to which the output voltage is applied, wherein the first oscillator is a Hartley oscillator, wherein the second oscillator is any one of a class $E^{-1}$ oscillator and a class E oscillator, and wherein the first LC resonator circuit is a second parallel circuit of a second inductor and a second series circuit including a third capacitor and a third inductor, which are connected in series to each other, and the phase-shifted output voltage is fed back from a connection point of the third capacitor and the third inductor to the amplifier element.

14. A contactless power supply system comprising:

a power transmission apparatus comprising a resonance oscillator circuit; and a power reception apparatus, wherein the resonance oscillator circuit comprises:

a first oscillator that includes a first LC resonator circuit and an amplifier element, and oscillates by shifting a phase of an output voltage with a predetermined phase difference and feeding a phase-shifted output voltage back to the amplifier element, the predetermined phase difference being determined to operate the first oscillator; and a second oscillator that oscillates by generating a gate signal, which has a frequency identical to that of the output voltage and drives the amplifier element, by shifting the phase of the output voltage with the predetermined phase difference and feeding the gate signal back to an input terminal of the amplifier element, by using the amplifier element as a switching element and using the first oscillator as a feedback circuit, wherein the predetermined phase difference is a value substantially independent of an inductance of the first LC resonator circuit and a load, to which the output voltage is applied, wherein the power reception apparatus comprises:

a second LC resonator circuit that is coupled to the first LC resonator circuit, and receives an AC power from the first LC resonator circuit, and a first rectifier circuit that rectifies the AC power received by the second LC resonator circuit to a DC voltage, and outputs the DC voltage to a predetermined load, and wherein the predetermined phase difference is a value substantially independent of inductances of the first and second LC resonator circuits and a load, to which the output voltage is applied, wherein the first oscillator is a Hartley oscillator, wherein the second oscillator is any one of a class $E^{-1}$ oscillator and a class E oscillator, and wherein the first LC resonator circuit is a second parallel circuit of a second inductor and a second series circuit including a third capacitor and a third inductor, which are connected in series to each other, and the phase-shifted output voltage is fed back from a connection point of the third capacitor and the third inductor to the amplifier element.

15. A resonance oscillator circuit comprising:

a first oscillator that includes a first LC resonator circuit and an amplifier element, and oscillates by shifting a phase of an output voltage with a predetermined phase difference and feeding a phase-shifted output voltage back to the amplifier element, the predetermined phase difference being determined to operate the first oscillator; and a second oscillator that oscillates by generating a gate signal, which has a frequency identical to that of the output voltage and drives the amplifier element, by shifting the phase of the output voltage with the predetermined phase difference and feeding the gate signal back to an input terminal of the amplifier element, by using the amplifier element as a switching element and using the first oscillator as a feedback circuit, wherein the predetermined phase difference is a value substantially independent of an inductance of the first LC resonator circuit and a load, to which the output voltage is applied, wherein the first oscillator is a back-coupling oscillator, wherein the second oscillator is any one of a class $E^{-1}$ oscillator and a class E oscillator, and wherein the first LC resonator circuit comprises a fourth capacitor and a back-coupling transformer, the back-coupling transformer including a primary inductor and a secondary inductor, which are back-coupled to each other, the fourth capacitor being connected in parallel to the primary inductor, and one end of the primary inductor being connected to one end of the secondary inductor, and the phase-shifted output voltage being fed back from another end of the secondary inductor to the amplifier element.

16. A contactless power supply system comprising:

a power transmission apparatus comprising a resonance oscillator circuit; and a power reception apparatus, wherein the resonance oscillator circuit comprises:

a first oscillator that includes a first LC resonator circuit and an amplifier element, and oscillates by shifting a phase of an output voltage with a predetermined phase difference and feeding a phase-shifted output voltage back to the amplifier element, the predetermined phase difference being determined to operate the first oscillator; and a second oscillator that oscillates by generating a gate signal, which has a frequency identical to that of the output voltage and drives the amplifier element, by shifting the phase of the output voltage with the predetermined phase difference and feeding the gate signal back to an input terminal of the amplifier element, by using the amplifier element as a switching element and using the first oscillator as a feedback circuit, wherein the predetermined phase difference is a value substantially independent of an inductance of the first LC resonator circuit and a load, to which the output voltage is applied, wherein the power reception apparatus comprises:

a second LC resonator circuit that is coupled to the first LC resonator circuit, and receives an AC power from the first LC resonator circuit, and a first rectifier circuit that rectifies the AC power received by the second LC resonator circuit to a DC voltage, and outputs the DC voltage to a predetermined load, and wherein the predetermined phase difference is a value substantially independent of inductances of the first and second LC resonator circuits and a load, to which the output voltage is applied, wherein the first oscillator is a back-coupling oscillator, wherein the second oscillator is any one of a class $E^{-1}$ oscillator and a class E oscillator, and wherein the first LC resonator circuit comprises a fourth capacitor and a back-coupling transformer, the back-coupling transformer including a primary inductor and a secondary inductor, which are back-coupled to each other, the fourth capacitor being connected in parallel to the primary inductor, and one end of the primary inductor being connected to one end of the secondary inductor, and the phase-shifted output voltage being fed back from another end of the secondary inductor to the amplifier element.

* * * * *